(12) United States Patent
Chang

(10) Patent No.: US 8,168,544 B2
(45) Date of Patent: May 1, 2012

(54) OXIDE ETCHING METHOD

(75) Inventor: Chienliu Chang, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 605 days.

(21) Appl. No.: 12/305,099

(22) PCT Filed: Jul. 18, 2007

(86) PCT No.: PCT/JP2007/064612
§ 371 (c)(1),
(2), (4) Date: Dec. 16, 2008

(87) PCT Pub. No.: WO2008/015944
PCT Pub. Date: Feb. 7, 2008

(65) Prior Publication Data
US 2009/0149030 A1 Jun. 11, 2009

(30) Foreign Application Priority Data

Aug. 1, 2006 (JP) .................................. 2006-209859

(51) Int. Cl.
*H01L 21/302* (2006.01)
(52) U.S. Cl. ......... 438/754; 438/738; 438/745; 216/101
(58) Field of Classification Search .................. 438/745, 438/754, 756, 735, 738; 216/83, 103, 101, 216/10
See application file for complete search history.

(56) References Cited

U.S. PATENT DOCUMENTS

| 5,366,588 | A | 11/1994 | Scholten et al. |
| 6,180,021 | B1 | 1/2001 | McLean et al. |
| 6,567,145 | B1 | 5/2003 | Kaneko et al. |
| 6,649,936 | B1 | 11/2003 | Sung et al. |
| 6,852,998 | B2 | 2/2005 | Sung et al. |
| 7,061,014 | B2 | 6/2006 | Hosono et al. |
| 7,179,527 | B2 | 2/2007 | Sato et al. |
| 7,183,145 | B2 * | 2/2007 | Tanaka et al. .................. 438/149 |
| 7,285,323 | B2 | 10/2007 | Sone et al. |
| 7,364,808 | B2 | 4/2008 | Sato et al. |
| 2003/0164498 | A1 * | 9/2003 | Sung et al. ....................... 257/43 |
| 2004/0072444 | A1 * | 4/2004 | Park et al. ...................... 438/710 |
| 2005/0255622 | A1 * | 11/2005 | Kokura et al. .................. 438/30 |
| 2007/0007538 | A1 | 1/2007 | Ono et al. |
| 2007/0170434 | A1 | 7/2007 | Inoue et al. |
| 2008/0152868 | A1 | 6/2008 | Sato et al. |

FOREIGN PATENT DOCUMENTS

| EP | 0560442 A1 | 9/1993 |
| EP | 1640748 A1 | 3/2006 |
| JP | 58-120780 A | 7/1983 |
| JP | 60-217636 A | 10/1985 |
| JP | 4-5756 B2 | 2/1992 |
| JP | 7-235219 A | 9/1995 |
| JP | 8-330692 A | 12/1996 |
| JP | 2004-103957 A | 4/2004 |
| JP | 2005-258115 A | 9/2005 |
| JP | 2006-164961 A | 6/2006 |
| WO | 03/036657 A1 | 5/2003 |
| WO | 2004/112440 A1 | 12/2004 |

OTHER PUBLICATIONS

Hwa-Min Kim et al., "Electrical and Optical Properties of In2O3-ZnO Films Deposited on Polyethylene Terephthalate Substrates by Radio Frequency Magnetron Sputtering," 42 Jpn. J.Appl. Phys. 223-27 (Jan. 2003).
Extended Abstracts of the 53rd Spring Meeting of the Japan Society of Applied Physics and Related Societies, 22a-P1-45, p. 653 (2006).
Elvira M. C. Fortunato et al., "Fully Transparent ZnO Thin-Film Transistor Produced at Room Temperature," 17(5) Advanced Materials 590-94 (Mar. 2005).
P. Barquinha et al., "Influence of the Semiconductor Thickness on the Electrical Properties of Transparent TFTs Based on Indium Zinc Oxide," 352 (9-20) Journal of Non-Crystalline Solids 1749-52 (Apr. 2006).
R.E. Presley, "Transparent Ring Oscillator Based on Indium Gallium Oxide Thin-Film Transistors," Solid-State 50 Electronics 500-503 (Mar. 2006).
Hideo Hosono, "Ionic Amorphous Oxide Semiconductors: Material Design, Carrier Transport, and Device Application," 352 Journal of Non-Crystalline Solids 851-858 (Apr. 2006).
L. Raniero et al., "Role of Hydrogen Plasma on Electrical and Optical Properties of ZGO, ITO and IZO Transparent and Conductive Coatings," 511-512 Thin Solid Films 295-298 (Jan. 2006).
Akihiro Takagi et al., "Carrier Transport and Electronic Structure in Amorphous Oxide Semiconductor, a-InGaZnO4," 486 Thin Solid Films 38-41 Feb. 2005).
Kenji Nomura et al.,"Room-temperature Fabrication of Transparent Flexible Thin-film Transistors Using Amorphous Oxide Semiconductors," 432(25) Nature 488-492 (Nov. 2004).
Walter Wohlmuth et al., "Properties of R.F. Magnetron Sputtered Cadmium-Tin-Oxide and Indium-Tin-Oxide Thin Films," 479 Thin Solid Films 223-231 (2005).
Office Action in Korean Application No. 10-2009-7004373 (Jun. 2011).
Examination Report in Taiwanese Application No. 096126409 (May 2011).
Communication pursuant to Article 94(3) EPC in European Application No. 07 768 466.0 (Oct. 18, 2011).

* cited by examiner

*Primary Examiner* — Lan Vinh
(74) *Attorney, Agent, or Firm* — Fitzpatrick, Cella, Harper & Scinto

(57) ABSTRACT

There is provided an etching method of an amorphous oxide layer containing In and at least one of Ga and Zn, which includes etching the amorphous oxide layer using an etchant containing any one of acetic acid, citric acid, hydrochloric acid, and perchloric acid.

4 Claims, 14 Drawing Sheets

OXIDE ETCHING METHOD

This application claims the benefit of Japanese Patent Application No. 2006-209859, filed Aug. 1, 2006, which is incorporated herein by reference in its entirety.

TECHNICAL FIELD

The present invention relates to an etching method of an oxide film containing In, Ga, and Zn with a high selectivity with respect to ITO (Indium Tin Oxide). More specifically, the present invention relates to a highly selective etching method of an oxide containing In and Zn and an oxide containing In and Ga which is employed in producing a fine electronic component such as a semiconductor device, a semiconductor integrated circuit, and an electrode.

BACKGROUND ART

In recent years, under circumstances where reductions in size, weight, and power consumption of electronic equipments have been advanced, transparent oxide semiconductors and transparent conductive oxides have been drawing attention in a field of display. In particular, since a film can be formed on a resin film at low temperatures, future application to a lightweight portable electronic equipment and the like is expected.

As disclosed in Japanese Patent Application Laid-open No. 2004-103957, oxide films containing In, Ga, and Zn are optically transparent, and are also widely studied for application to transparent electrodes, transistors, and the like by reducing the resistance. Further, H. M. Kim et al., Jpn. J. Appl. Phys. Vol. 42, 2003, p. 223-227 and R. E. Presley et al., Vol. 50, Issue 3, March 2006, p. 500-503 disclose that reports have been made on researches on oxide films containing In and Zn or oxide films containing In and Ga.

In addition, researches and developments on oxide films containing In, Ga, and Zn and growing conditions of the films have also been made. In addition, production of a semiconductor device using an oxide film containing In, Ga, and Zn on a plastic film is reported by Chienliu Chang, et al. in Extended Abstracts of the 53th Spring Meeting of The Japan Society of Applied Physics and Related Societies, 22a-P1-45/II, p. 653, (2006).

Heretofore, patterning of produced oxide films containing In, Ga, and Zn, oxide films containing Ga and Zn, and oxide films containing In and Zn have been performed by the lift-off process. The lift-off process is disclosed in K. Nomura et al., Nature, Vol. 432, 25 Nov. 2004, p. 488-492, E. M. C. Fortunato et al., Advanced Materials, 2005, 17, No. 5, p. 590-594, P. Barquinha et al., Journal of Non-Crystalline Solid Vol. 352, Issues 9-20, 2006, pp. 1749-1752, etc.

For concise description, an oxide film containing In, Ga, and Zn (In—Ga—Zn oxide) is hereinafter referred to as IGZO. Similarly, an oxide film containing In and Zn (In—Zn oxide) is hereinafter referred to as IZO. Similarly, an oxide film containing In and Ga (In—Ga oxide) is hereinafter referred to as IGO. When semiconductor devices are produced using these transparent oxide semiconductors as an active layer, indium-tin oxide (ITO) films are generally used as a transparent conductive electrode.

In Japanese Patent Application Laid-open Nos. S58-120780 and S60-217636, and Japanese Patent Publication No. H04-5756, at least one kind of sulfuric acid, hydrochloric acid, nitric acid, and ferric chloride is used as a wet etching liquid (also referred to as "etchant") of ITO. In Japanese Patent Application Laid-open No. 2005-258115, oxalic acid, a mixed acid of phosphoric acid, acetic acid, and nitric acid, an aqueous cerium ammonium nitrate solution, or the like is used as an etching liquid (also referred to as "etchant") of IZO.

DISCLOSURE OF THE INVENTION

However, the lift-off process as described above has a problem that a photoresist is melted and deformed at a high temperature. The lift-off process has another problem that when a photoresist is removed, an edge of a pattern of a deposited film is curved up, and thereafter an electric wire crossing over the pattern edge is liable to be broken, which lowers the production yield. In particular, there is a pollution problem that a photoresist is contaminated into a formed film due to a lift-off step.

In order to practically use the oxide film containing In, Ga, and Zn for the above-mentioned various uses, the oxide film containing In, Ga, and Zn needs to be processed. Therefore, in order to achieve a desired shape with high reproducibility, various etching methods have been studied as a patterning method other than the lift-off process. The etching method is roughly classified into two methods. One is wet etching in which a sample is immersed in a chemical agent, and the other one is dry etching utilizing a gaseous etching medium. Theoretically, the dry etching method has an advantage that chemically active ions generated in a plasma bombard vertically on the surface of the substrate, so that the etched shape is faithfully transferred from the mask pattern. However, maintenance costs for a dry etching apparatus body, a circumferential gas supply system, exhaust gas processing of a chlorine-based gas, power consumption and the like are remarkably large, and there is also a problem of short life of the apparatus due to particle contamination or the like. Further, there is a case where the control of highly selective etching is difficult due to ion impact. In addition, when considering future production of large area displays, there is a fear that high capacities and large costs are necessary for a chamber, a vacuum system, and the like of the dry etching apparatus. In contrast, in the wet etching, the etching proceeds isotropically, so that there arises a problem of generating a phenomenon such as an undercut beneath a mask. However, the wet etching has an advantage that the apparatus cost is significantly reduced compared with the dry etching. Moreover, the wet etching is considered to be suitable for mass production because of its ease of control and management of concentration and temperature conditions of an etching liquid (also referred to as "etchant").

When etching transparent oxides such as the above-mentioned IGZO, IZO, and IGO, the selectivity of an etching liquid to an ITO electrode is very important.

On the other hand, the composition of the oxide and the film deposition conditions can be adjusted to obtain a large change in the electrical conductivity. Therefore, there can be adopted a stack structure in which a semiconductor active layer, a high-conductivity electrode layer, and wiring are formed by using only the transparent oxides such as IGZO, IZO, and IGO without using ITO. Therefore, in the case of producing a device using only the transparent oxides such as IGZO, IZO, and IGO without using ITO, the etch selectivity of these oxides becomes a major subject. If the etch selectivity is insufficient, there are cases where a material not to be etched may be etched, which may increase variation in the performance of electronic devices, thus resulting in reduction of the yield.

Hitherto, although there have been indications of IGZO and IGO films, there has been no explicit disclosure of etching methods therefor. The aforementioned documents disclose the etching methods for the transparent indium oxide film containing IGZO, IZO, and IGO, but have no description of the selectivity to an ITO conductive film, for example. As described above, the conventional etching liquids have no selectivity with regard to differences in oxides. Therefore, when producing a device in which different kinds of oxides containing indium coexist, there is posed a problem that it is difficult to precisely control the etching.

The present invention has been accomplished to solve the above-mentioned problems. That is, the present invention provides a method of etching a structure in which IZO and ITO, IGZO and ITO, IGO and ITO, IZO and IGZO, IZO and IGO, or IGZO and IGO coexist. More specifically, the present invention provides an etching method of performing selective etching by using an etching liquid having selectivity for different substances.

The present invention also provides an etching method by which precise and easy etching can be performed in a thin film semiconductor device containing two or more kinds of oxide films selected from IGZO, IZO, IGO, and ITO.

The present inventor has conducted extensive study on the deposition conditions and etching conditions of films containing IGZO, IZO, or IGO, and thin film semiconductor devices using such films. As a result, the present inventor has found that a layer structure including two or more kinds of indium oxide films selected from IGZO, IZO, IGO, and ITO can be selectively etched by using a etching liquid containing any one of acetic acid, organic acid, hydrochloric acid, or perchloric acid.

The present invention has been accomplished based on the above-mentioned finding and provides an etching method of an amorphous oxide layer containing In and at least one of Ga and Zn, which includes etching the amorphous oxide layer using an etching liquid containing any one of acetic acid, citric acid, hydrochloric acid, and perchloric acid.

Further, the present invention provides an etching method of an amorphous oxide layer containing In and at least one of Ga and Zn in a structure including an ITO layer and the amorphous oxide layer, which includes selectively etching the amorphous oxide layer using an etching liquid containing any one of acetic acid, citric acid, hydrochloric acid, and perchloric acid.

Moreover, the present invention provides an etching method of an amorphous oxide layer containing In and Zn, or In, Ga, and Zn in a structure including an oxide layer containing In and Ga and the amorphous oxide layer, which includes selectively etching the amorphous oxide layer using an etching liquid containing any one of acetic acid, citric acid, hydrochloric acid, and perchloric acid.

In addition, the present invention provides an etching method of an amorphous oxide layer containing In and Zn in a structure including an oxide layer containing In, Ga, and Zn and the amorphous oxide layer, which includes selectively etching the amorphous oxide layer using an etching liquid containing any one of acetic acid, citric acid, hydrochloric acid, and perchloric acid.

According to the present invention described above, precise and highly selective wet etching can be performed in a thin film semiconductor device including two or more kinds of oxide films selected from IGZO, IZO, IGO, and ITO. Further, the thin film semiconductor device produced by the etching method of the present invention and by using the etching liquid having remarkable selectivity of the present invention is advantageous in that the device performance is not variable and is stabile and uniform, and that the device productions steps are simple and easy to carry out.

For example, in a production process of a transistor device having a transparent semiconductor oxide film containing IGZO provided a substrate is used for a channel layer and ITO is used for a drain electrode and a gate electrode thereof, highly selective etching can be performed.

Further features of the present invention will become apparent from the following description of exemplary embodiments with reference to the attached drawings.

BEST MODE FOR CARRYING OUT THE INVENTION

Figure 1:
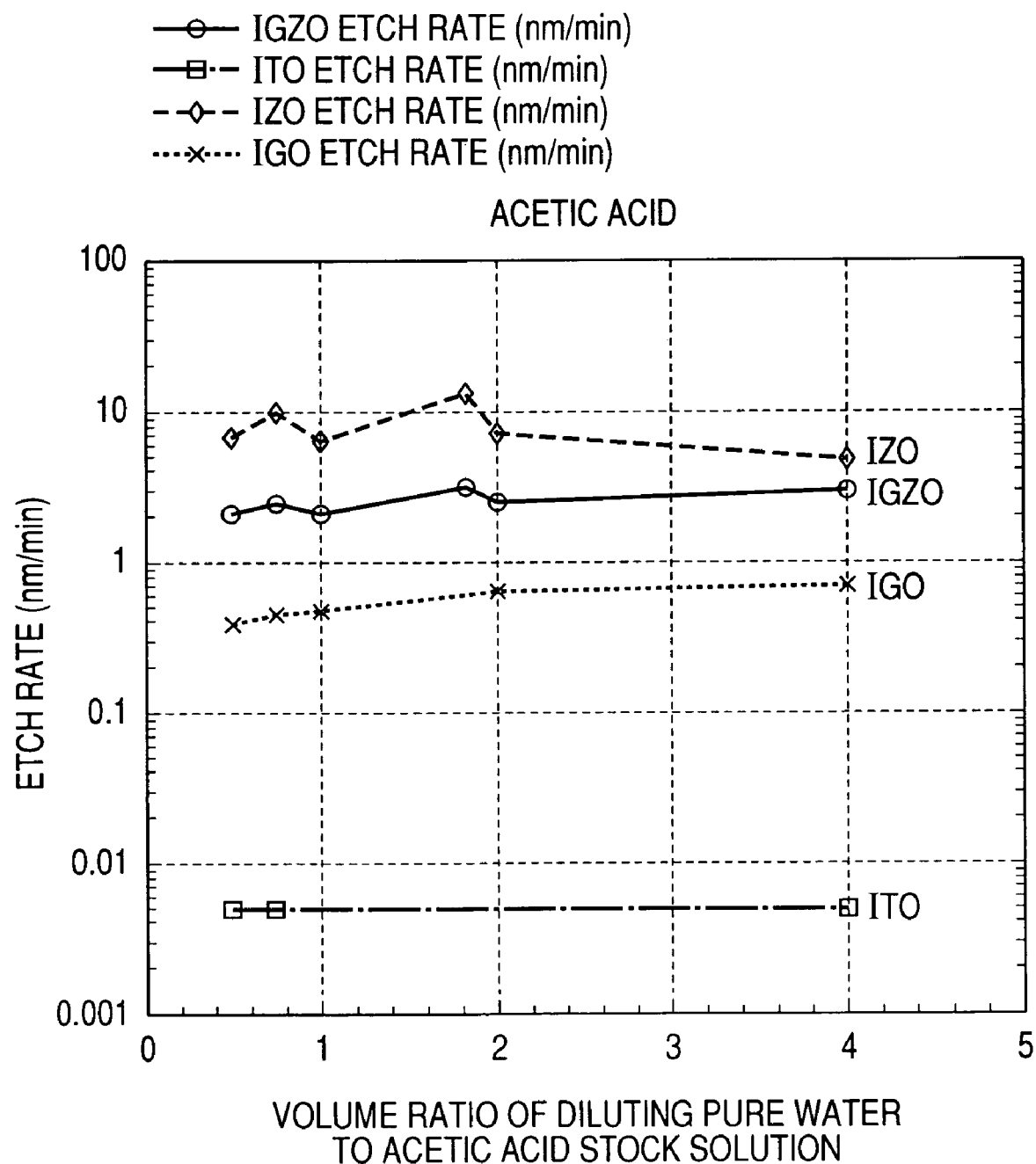
FIG. 1 is a graphical representation illustrating acetic acid concentration dependence of an etch rate of an indium oxide film, for explaining an etching liquid containing acetic acid according to Example 1 of the method of the present invention.

According to the present invention, etching can be precisely controlled when producing a device in which different kinds (or a plurality) of indium oxides coexist. Examples of the specific material to be etched include those having a structure in which IZO and ITO, IGZO and ITO, IGO and ITO, IZO and IGZO, IZO and IGO, or IGZO and IGO coexist. By using as an etching liquid for etching such a structure, an etching liquid can be obtained which has selectivity for different substances.

Hereinafter, etching liquids used in the present invention will be described in detail.

As acetic acid for use in the present invention, commercially available acetic acid liquid (100% by weight of glacial acetic acid; density of 1.05; hereinafter referred to as "stock solution") may be used as such, or may be diluted with pure water in an amount, up to 4 times the volume of the stock solution and then used. In order to maintain a high etch selectivity (about 2.8 or more and 4.3 or less) of IZO to IGZO, it is more desirable to dilute the stock solution with pure water in an amount 0.5 to 2 times the volume of the stock solution (concentration: 34% or more and 68% or less). The etching process using the acetic acid is performed by immersing an etching object in an aqueous acetic acid solution at room temperature (about 20° C.).

Next, organic acids are described. Usable organic acids are not limited to citric acid, and examples thereof include any generally known organic acids, such as malonic acid, malic acid, tartaric acid, oxalic acid, formic acid, glycolic acid, and maleic acid. A ligand existing in an organic acid, for example, $COO^-$ is combined with In to form a complex ion under specific conditions and is dissolved. Hereinafter, description will be made by taking citric acid as an example. The citric acid is a solution prepared by dissolving commercially available citric acid (citric acid monohydrate; chemical formula: $C_3H_4(OH)(COOH)_3.H_2O$; white solid crystal) in pure water completely. The citric acid concentration of an etching liquid containing citric acid of room temperature (about 20° C.) is desirably 3.8% by weight or more and 45% by weight or less. In order to maintain a high etch selectivity (about 26 or more and 55 or less) of IGO to ITO, the citric acid concentration is more desirably 3.8% by weight or more and 29% by weight or less. When the citric acid concentration is less than 3.8% by weight, the etch rates of all oxides containing indium are lowered, so that the etch selectivity is remarkably reduced. When the citric acid concentration is more than 45% by weight, there are cases where citric acid crystals may be precipitated in an aqueous etching solution containing citric acid.

The temperature of the etching liquid containing citric acid is desirably within the range of 20° C. or more and 55° C. or less, and more desirably within the range of 40° C. or more and 55° C. or less. When the aqueous citric acid solution is at about 50° C., the etch selectivities of the indium oxides including IZO, IGZO, and IGO to ITO do not significantly change, but the etch rate increases by approximately one order of magnitude from that at room temperature. In this case, in order to make the concentration constant, a unit for cooling, condensing, and collecting water that has evaporated from the etching liquid needs to be provided.

It is desirable that the citric acid concentration of the etching liquid containing citric acid of 50° C. be within the range of 3.8% by weight or more and 45% by weight or less. In order to maintain a high etch selectivity (from about 7.3 to 9.6) of IZO with respect to IGZO, it is more desirable that the citric acid concentration be within the range of 16% by weight or more and 45% by weight or less. In view of the above experimental results, it is most desirable that the citric acid concentration of the etching liquid containing citric acid at a temperature within the range of room temperature to 55° C. be within the range of 16% by weight or more and 29% by weight or less. Within the above concentration range, the etch selectivities of the indium oxides including IZO, IGZO, and IGO with respect to ITO are the highest and stable, without depending on the etching liquid temperatures.

As the hydrochloric acid, commercially available concentrated hydrochloric acid (containing 37.2% by weight of hydrogen chloride and having a density of 1.18, which will hereinafter be referred to as "stock solution") may be used as such or may be diluted with pure water in an amount 60 or less times the volume of the stock solution and used. In order to highly and stably maintain the etch selectivities of the indium oxides including IZO, IGZO, and IGO with respect to ITO, it is desirable that the hydrochloric acid stock solution used for the etching liquid be diluted with pure water in an amount 4 to 60 times the volume of the stock solution (concentration: 0.7% by weight or more and 8.5% by weight or less). It is more desirable that the stock solution be diluted with pure water in an amount 4 to 40 times the volume of the stock solution (concentration: 1.0% by weight or more and 8.5% by weight or less). In order to make easy the control of etching time, the most desirable hydrochloric acid concentration is obtained by diluting the stock solution with pure water in an amount 10 to 30 times the volume of the stock solution (concentration: 1.4% by weight or more and 4.0% by weight or less). The etching process using hydrochloric acid is performed through immersion in an aqueous hydrochloric acid solution of room temperature (about 20° C.).

As the perchloric acid, commercially available concentrated perchloric acid solution (concentration: 70% by weight; chemical formula: $HClO_4$; density: 1.673; hereinafter referred to as "stock solution") may be used as such or may be diluted with pure water in an amount 20 or less times the volume of the stock solution. In the etching liquid containing perchloric acid, a desirable perchloric acid concentration is obtained through dilution with pure water in an amount 1 to 20 times the volume of the stock solution (concentration: 5% by weight or more and 44% by weight or less). The most desirable perchloric acid concentration is obtained through dilution with pure water in an amount 2 to 10 times the volume of the stock solution (concentration: 10% by weight or more and 32% by weight or less). By adding pure water of such quantity to the stock solution, the etch rate notably increases as compared with that of the stock solution. The etching process using perchloric acid is performed through immersion in an aqueous perchloric acid solution of room temperature (about 20° C.).

By the use of the above-mentioned etching liquids, the etch rates of the indium oxides can be set so as to be IZO>IGZO>IGO>ITO.

According to the present invention, the production yields of semiconductor devices when using the oxide films containing indium, such as IZO, IGZO, and IGO as an active layer and an electrode can be remarkably improved. In particular, such high production yield is important in the case of large area substrates.

Further, in a desirable embodiment, film deposition may be performed in an atmosphere containing oxygen gas without intentionally adding impurity ions for increasing the electric resistance of the oxide thin film containing indium. By adjusting the oxygen concentration and the film deposition temperature, the electric resistance of the oxide containing indium can be adjusted.

Incidentally, the oxide films containing indium are produced by a thin film deposition process selected from sputtering process, vapor deposition process, CVD process, epitaxial growth process, photo induced deposition process, pulse laser vapor deposition process, and ion plating process. Of those, the sputtering process is most suitable from the viewpoint of mass productivity.

Because the conductivities of the indium oxide films including IZO, IGZO, and IGO strongly depend on temperature, it is desirable not to increase the temperature as far as possible in a wet etching process. As the temperature increases, the conductivities of the oxide films containing In, Ga, and Zn increase. Therefore, the above-mentioned wet etching process temperature is desirably set to 60° C. or less.

In addition, in a TFT using the indium oxide thin film including IZO, IGZO, and IGO, the resistance of the film can be adjusted by film deposition conditions, so that the oxide film can be utilized not only as an active layer but also as pixel wiring for liquid crystals. Incidentally, as the material of the oxide film containing indium, at least one of impurities such as Sn, Al, Sb, Cd, Ge, P, As, N, and Mg can be added to compounds including IZO, IGZO, and IGO.

Further, when using a plastic resin substrate, it is desirable to use an etching liquid containing a weak acid (organic acids such as acetic acid or citric acid), or hydrochloric acid or perchloric acid with a lower concentration. This is because degradation may increase with increase of the etching temperature. In particular, when a substrate is made of a resin such as polyimide, polyethylene terephthalate, or polyethylenenaphthalate, the acid resistance thereof is insufficient. Therefore, it is desirable to use hydrochloric acid or perchloric acid that has been diluted with pure water. A desirable hydrochloric-acid concentration at room temperature is obtained by diluting the stock solution with pure water in an amount of 4 to 60 times the volume of hydrochloric acid stock solution. Since immersion in a short period of time is also desirable, a more desirable hydrochloric acid concentration at room temperature is obtained by diluting the stock solution with pure water in an amount 10 to 30 times the volume of hydrochloric acid stock solution.

Incidentally, when using the plastic resin substrate, a desirable perchloric acid concentration at room temperature is obtained by diluting the stock solution with pure water in an amount 1 to 20 times the volume of perchloric-acid stock solution. A more desirable perchloric acid concentration at room temperature is obtained by dilution with pure water in an amount 2 to 10 times the volume of perchloric-acid stock solution. By immersing the above-mentioned resin substrate in the dilute hydrochloric acid or dilute perchloric acid having a concentration within the above-mentioned desirable concentration range for a short period of time (e.g., for 15 minutes), the above-mentioned resin substrate becomes insusceptible to notable degradation or decomposition such as dissolution and swelling.

It is known that the above-mentioned acid etching liquid, i.e., solution of any one of acetic acid, organic acid, hydrochloric acid, and perchloric acid, cannot etch a gate insulation film such as a silicon nitride film, which is generally used commonly. In place of the silicon nitride film, silicon oxide or dielectric materials such as silicon oxynitride, $HfO_2$, HfAlO, HfSiON, or $Y_2O_3$ can be applied to a TFT device as the gate insulation film without being etched by the above-mentioned acid etching liquid.

EXAMPLES

Hereinafter, the present invention will be described according to the following examples with reference to the attached drawings, but is not limited to the following examples. In each of the drawings, the shape, dimension, and arrangement of each constitutional element are roughly shown in such a manner that the present invention can be understood.

In the present invention, when it is described that a layer (or a layer structure obtained by patterning a layer) is formed on another layer or a substrate, it is to be understood that the layer may be formed directly on the another layer or the substrate, or a third layer may be provided therebetween.

Example 1

Etch Rate Measurement

In Example 1, a specific example of an etching method of an indium oxide film including IZO, IGZO, IGO, and ITO of the present invention will be described.

First, experimental samples are produced according to a procedure described below. A Si substrate (525 mm in thickness) having a 100 nm thick Si thermal oxide film provided thereon is used as a base. Three oxide films of an IGZO film, an IZO film, and an IGO film are formed on the Si substrate with the Si thermally oxide film by reactive sputtering under the conditions shown in Table 1 below.

Incidentally, indium oxide thin films of IGZO, IZO, and IGO each containing microcrystals are deposited on the substrate by the above-mentioned spattering film deposition method. Considering that the incidence X-ray diffraction (angle of incidence: 0.5°) of the IGZO, IZO, and IGO thin films shows no clear diffraction peak, it can be said that the produced IGZO, IZO, and IGO thin films are amorphous.

As a glass substrate with ITO, a commercially available glass substrate with a polycrystalline ITO film of 29 nm in thickness is used.

TABLE 1

| Material | IGZO | IZO | IGO |
|---|---|---|---|
| $O_2$ partial pressure | 3.40% | 0.97% | 0.97% |
| Film forming pressure (Pa) | 0.5 | 0.4 | 0.4 |
| Film thickness | ~563 nm | ~393 nm | ~325 nm |

Next, a line-and-space resist pattern with a line width of 100 micron and a space width of 100 micron is formed on the IGZO, IZO, IGO, and ITO thin films by a known photolithography method. The resist used is a positive resist AZ1500 (trade name; 20 cp) manufactured by Clariant. A Si substrate with the resist is hard baked at a temperature of about 120° C. using a baking furnace to thereby obtain samples for etching experiments. The hard bake process is carried out for improving the adhesion of the resist during wet etching to be performed later and the resistance against an etching liquid.

Next, deionized water (DI water) was added to each of the commercially available reagents shown in Table 2 below to adjust the concentration to a desired value. The samples for etching experiments were immersed in the concentration-adjusted etching liquids to thereby etch the IGZO, IZO, IGO, and ITO thin films exposed from the resist pattern.

TABLE 2

| Reagent | Chemical Formula | Stock Solution Concentration | Specific Gravity of Liquid |
|---|---|---|---|
| Acetic acid | $CH_3COOH$ | 100% (glacial acetic acid) | 1.05 |
| Citric acid 1-hydrate | $C_3H_4(OH)(COOH)_3 \cdot H_2O$ | White crystal (Citric acid monohydrate) | Solid |
| Hydrochloric acid | HCl | 35 to 37% | 1.18 |
| Perchloric acid | $HClO_4$ | 70% | 1.673 |

Incidentally, it is desirable to heat the etching liquid in a water bath. In order to maintain the concentration, evaporation from an etching liquid is suppressed by use of a lid, and evaporated water is frequently replenished. After etching is completed, the resist of each sample is stripped with acetone. Then, the patterns of the indium oxide films are measured and observed. The step difference produced by the etching is measured with a surface profiler (trade name: Alpha-Step) and ellipsometer manufactured by KLA-Tencor Corporation, and the etch rate is accurately computed.

Figure 2:
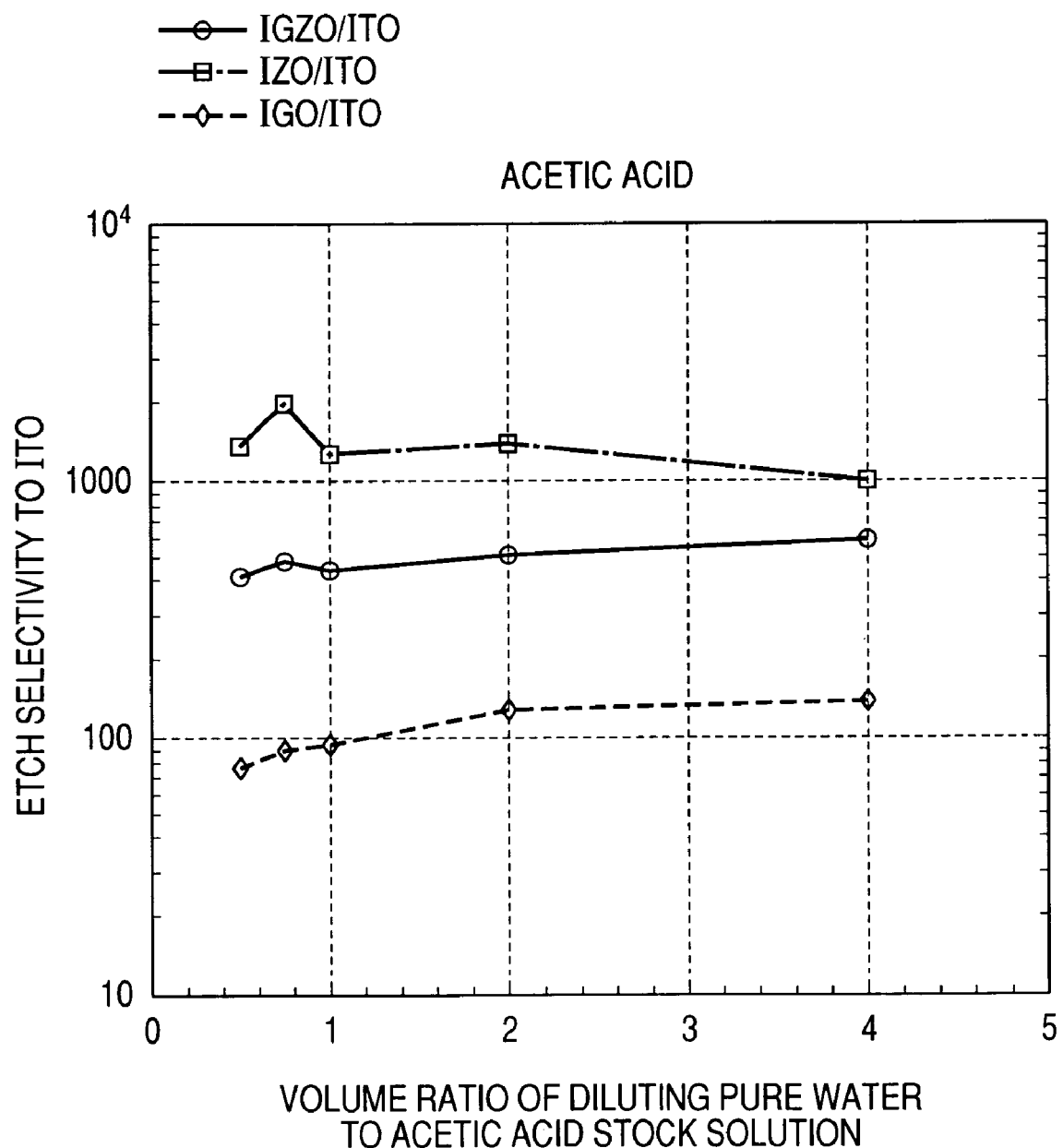
FIG. 2 is a graphical representation illustrating acetic acid concentration dependence of an etch selectivity of an indium oxide film to ITO, for explaining an etching liquid containing acetic acid according to Example 1 of the method of the present invention.

FIG. 1 is a graphical representation illustrating the acetic acid concentration dependence of the etch rates of IZO, IGZO, IGO, and ITO when an aqueous acetic acid water solution is used at room temperature (ordinate: etch rate (nm/min); abscissa: volume ratio of diluting pure water to acetic acid stock solution). FIG. 2 is a graphical representation illustrating the acetic acid concentration dependence of the etch selectivities of IZO, IGZO, and IGO with respect to ITO obtained by converting the data of FIG. 1 (ordinate: etch selectivity to ITO; abscissa: volume ratio of diluting pure water to acetic acid stock solution). As shown in FIGS. 1 and 2, when the acetic acid concentration is within the range from that of the stock solution to that of a solution prepared by dilution with pure water in an amount 4 or less times the volume of the stock solution (concentration: 20% by weight or more and 100% by weight or less), the etch rates of the indium oxides can be stably set so as to be IZO>IGZO>IGO>ITO. When the pure water content of the etching liquid further increases, the etch selectivity is lost and the etch rate is not practical. In order to maintain a high etch selectivity (about 2.8 or more and 4.3 or less) of IZO to IGZO, it is more desirable to dilute with pure water in an amount of 0.5 to 2 times the volume of the stock solution (concentration: 34% or more and 68% or less). Further, because the vapor pressure of acetic acid is high, it is desirable to, for example, inhibit its evaporation from the etching liquid by use of a lid or the like.

Figure 3:
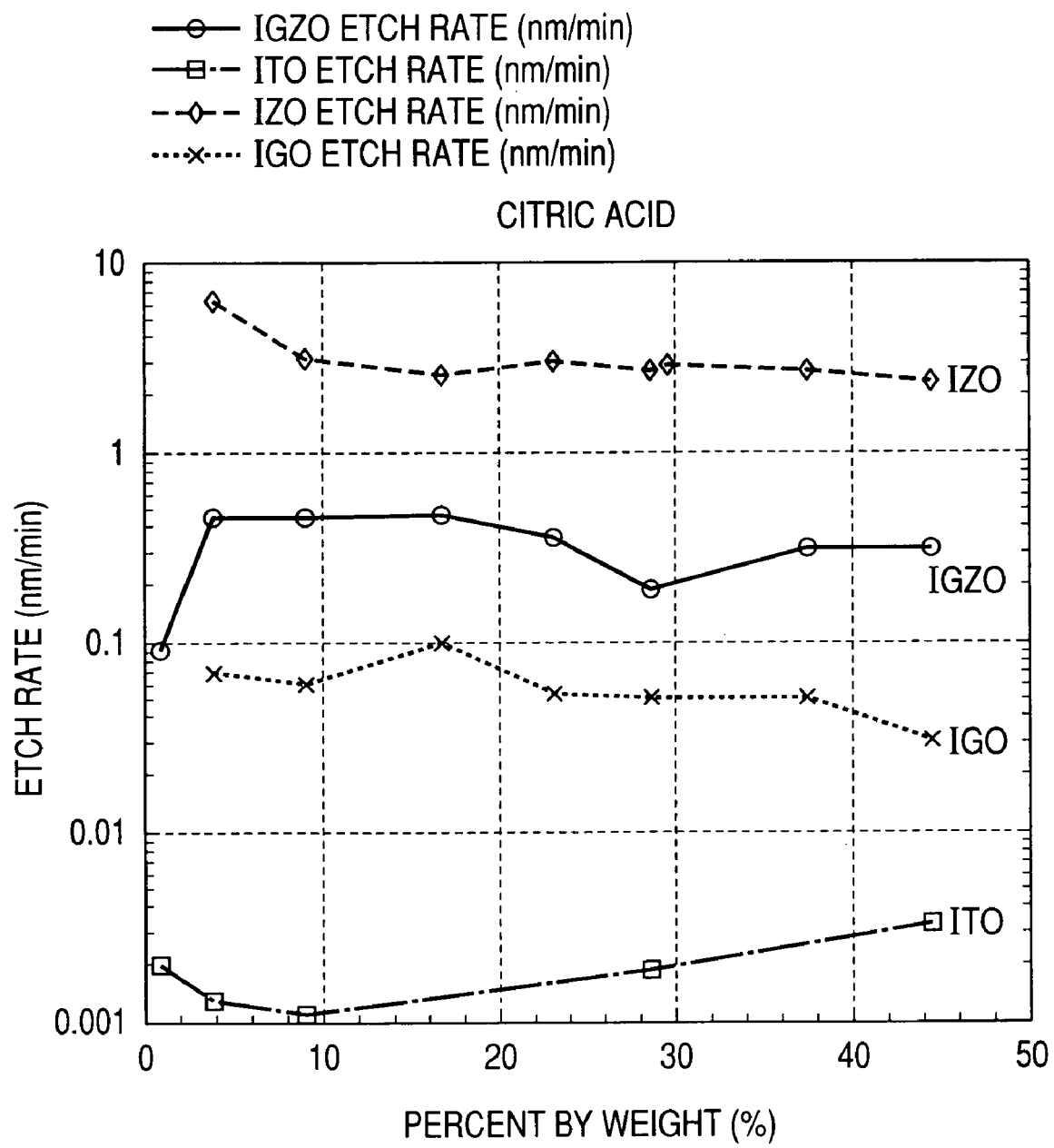
FIG. 3 is a graphical representation illustrating room temperature citric acid concentration dependence of an etch rate of an indium oxide film, for explaining an etching liquid containing citric acid according to Example 1 of the method of the present invention.
Figure 4:
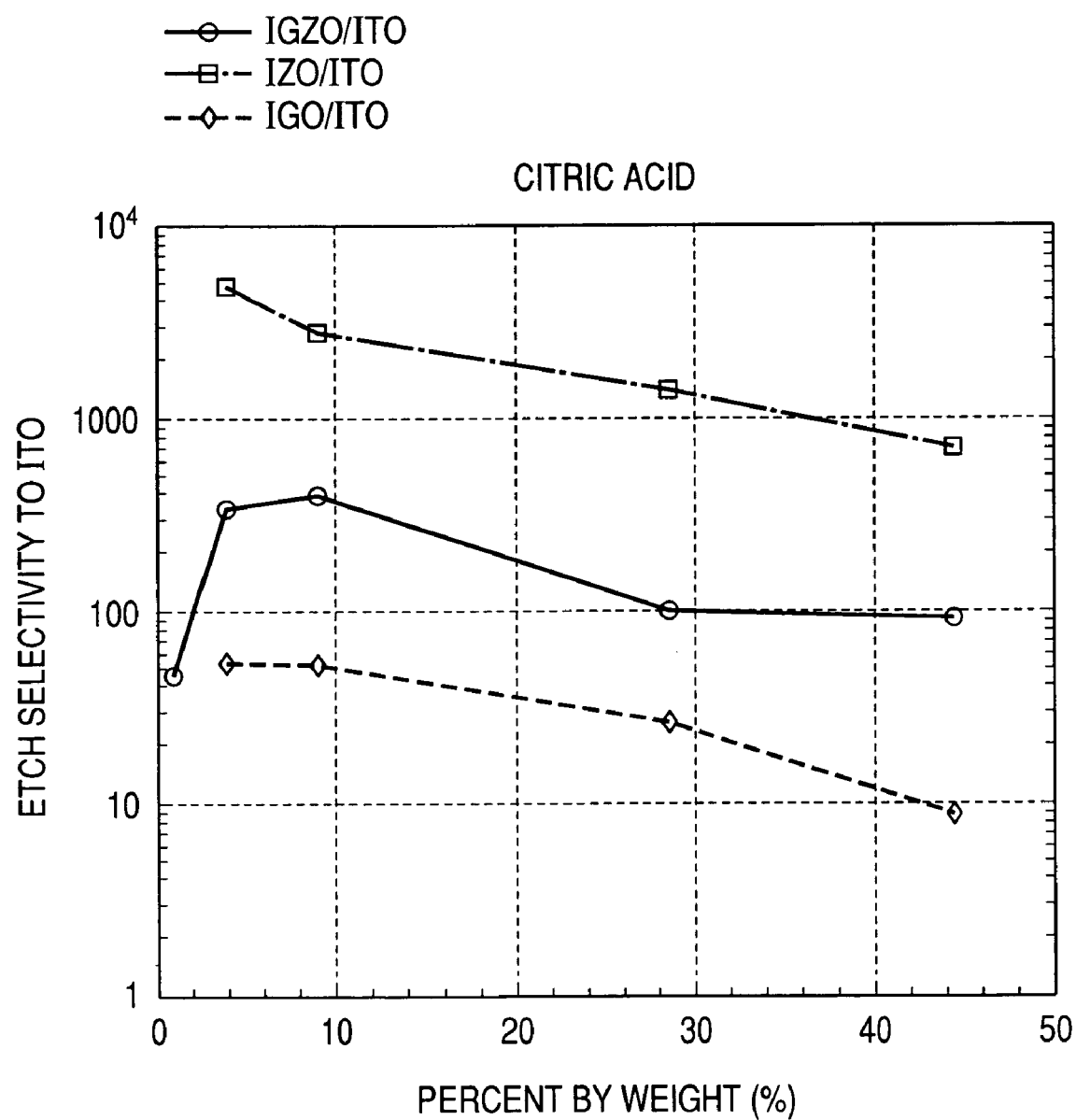
FIG. 4 is a graphical representation illustrating room temperature citric acid concentration dependence of an etch selectivity of an indium oxide film to ITO, for explaining an etching liquid containing citric acid according to Example 1 of the method of the present invention.

FIG. 3 is a graphical representation illustrating the citric acid concentration dependence of the etch rates of IZO, IGZO, IGO, and ITO when an aqueous citric acid solution is used as an organic acid at room temperature (ordinate: etch rate (nm/min); abscissa: % by weight concentration of citric acid). FIG. 4 is a graphical representation illustrating the citric acid concentration dependence of the etch selectivities of IZO, IGZO, and IGO to ITO obtained by converting the data of FIG. 3 (ordinate: etch selectivity to ITO, abscissa: % by weight concentration of citric acid). Usable organic acids are not limited to citric acid, and usable are any generally known organic acids, such as malonic acid, malic acid, tartaric acid, and oxalic acid. Citric acid is used in this example. As shown in FIGS. 3 and 4, the citric acid concentration of a room-temperature (about 20° C.) etching liquid containing citric acid is desirably 3.8% by weight or more and 45% by weight or less. In order to maintain a high etch selectivity (about 26 or more and 55 or less) of IGO to ITO, the citric acid concentration is desirably 3.8% by weight or more and 29% by weight or less. When the citric acid concentration is less than 3.8% by weight, the etch rates of all the indium oxides are lowered and the selectivities remarkably decrease. When the citric acid concentration exceeds 45% by weight, citric acid crystals precipitate in the aqueous etching solution containing citric acid.

Figure 5:
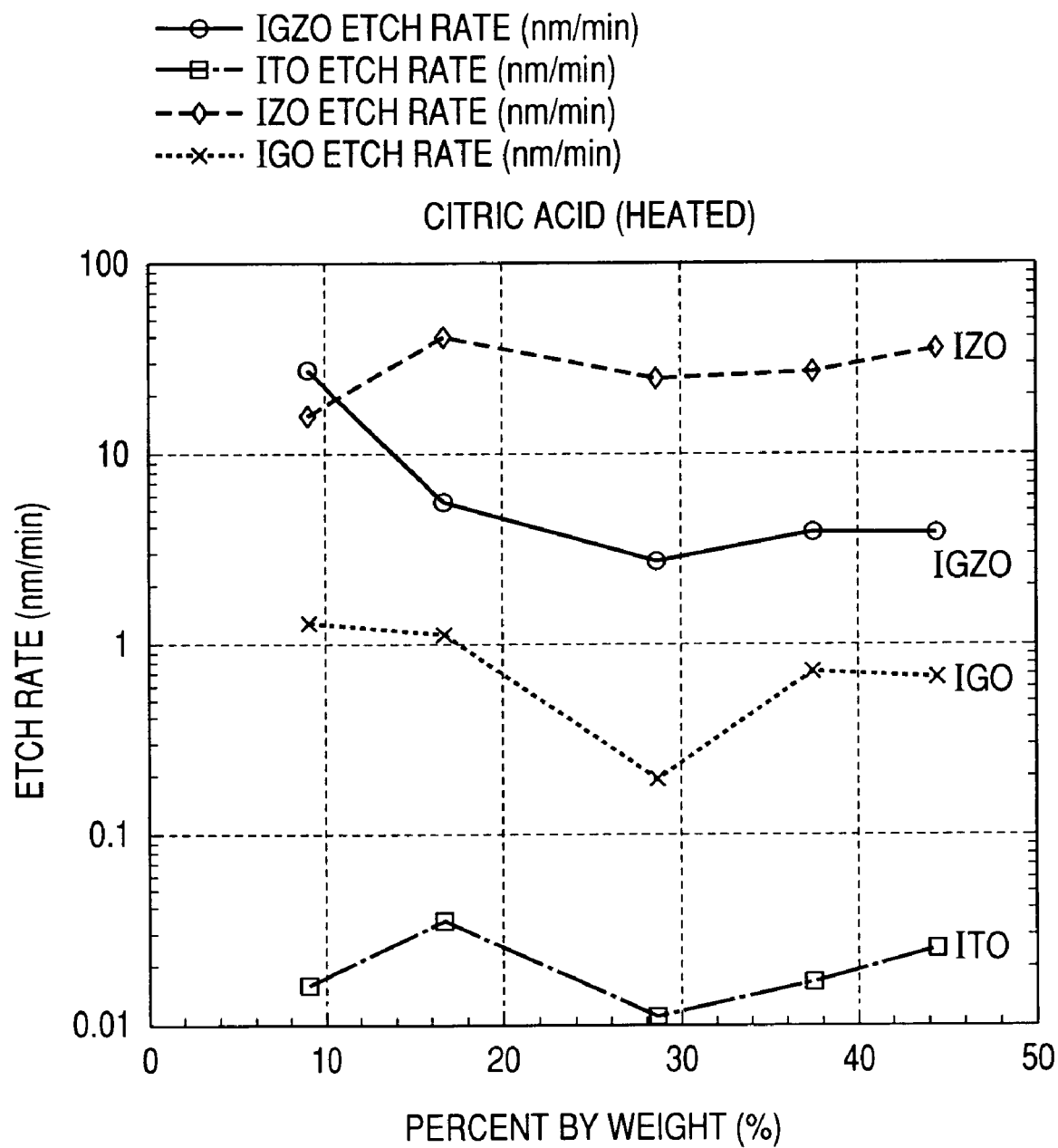
FIG. 5 is a graphical representation illustrating citric acid concentration dependence at 50° C. of an etch rate of an indium oxide film, for explaining an etching liquid containing citric acid according to Example 1 of the method of the present invention.
Figure 6:
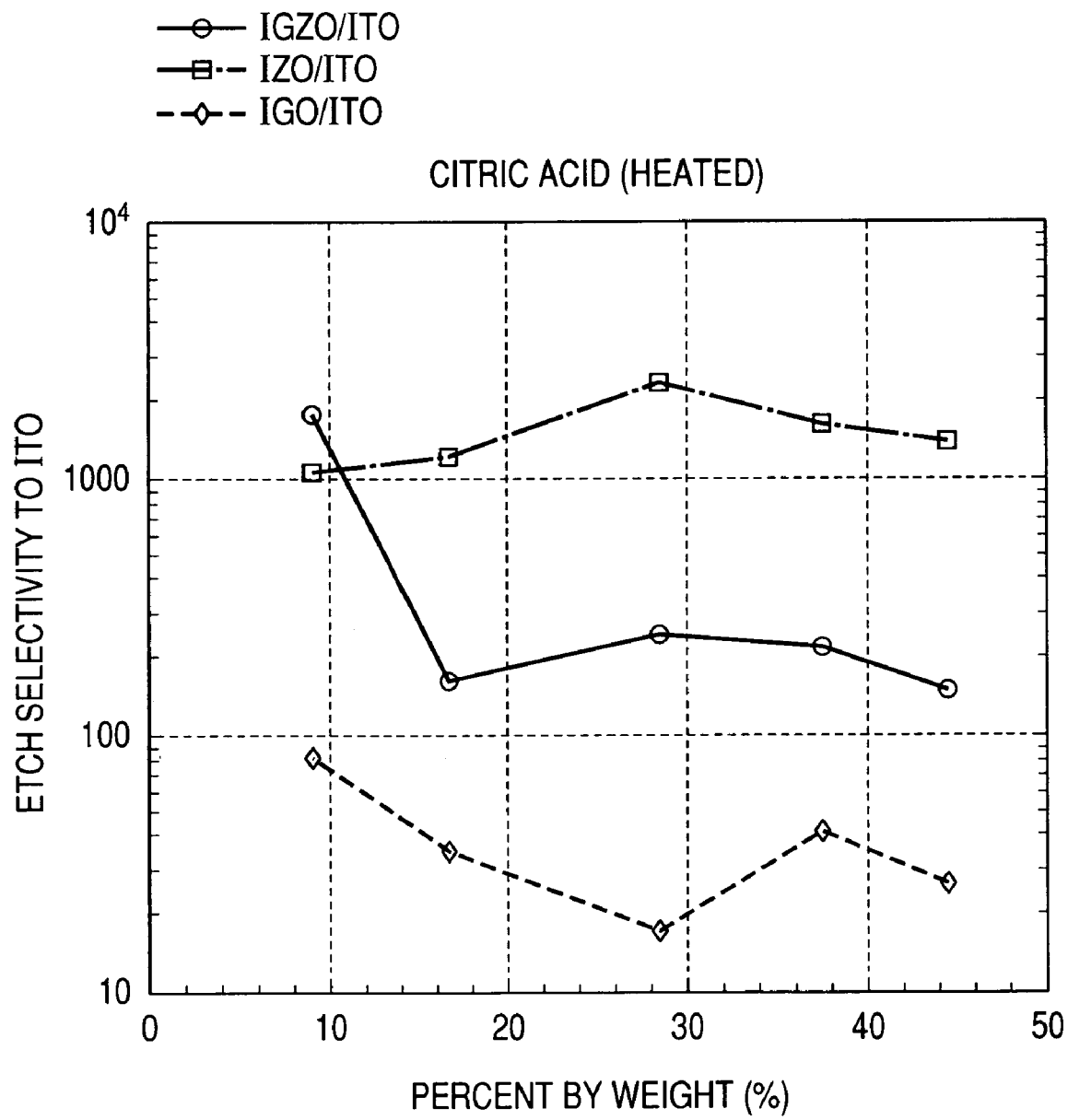
FIG. 6 is a graphical representation illustrating citric acid concentration dependence at 50° C. of an etch selectivity of an indium oxide film to ITO, for explaining an etching liquid containing citric acid according to Example 1 of the method of the present invention.

FIG. 5 is a graphical representation illustrating the citric acid concentration dependence at 50° C. (±5°C.) of the etch rates of IZO, IGZO, IGO, and ITO (ordinate: etch rate (nm/min); abscissa: % by weight concentration of citric acid). FIG. 6 is a graphical representation illustrating the citric acid concentration dependence at 50° C. of the etch selectivities of IZO, IGZO, and IGO to ITO obtained by converting the data of FIG. 5 (ordinate: etch selectivity to ITO; abscissa: % by weight concentration of citric acid).

Comparing FIGS. 3, 4, 5, and 6, the etch rates of the indium oxides including IZO, IGZO, IGO, and ITO increase at near 50° C. by approximately one order of magnitude as compared to that at room temperature, and the etch selectivities with respect to ITO also increase slightly. Therefore, in order to make the etch selectivity higher, the temperatures of the etching liquid containing citric acid is desirably 20° C. or more and 55° C. or less, and more desirably 40° C. or more and 55° C. or less. As is seen from in FIGS. 5 and 6, the citric acid concentration of the etching liquid containing citric acid of 50° C. is desirably 3.8% by weight or more and 45% by weight or less. In order to maintain a high etch selectivity (from about 7.3 to 9.6) of IZO to IGZO, the citric acid concentration of the etching liquid containing citric acid is desirably 16% or more and 45% by weight or less. In view of the above experimental results, it is most desirable that the citric acid concentration of the etching liquid containing citric acid be not less than 16% by weight and not more than 29% by weight within the temperature range of from room temperature to 55° C. In the above concentration range, the etch selectivities of the indium oxide including IZO, IGZO, and IGO to ITO are most stable without depending on the temperature of the etching liquid.

Figure 7:
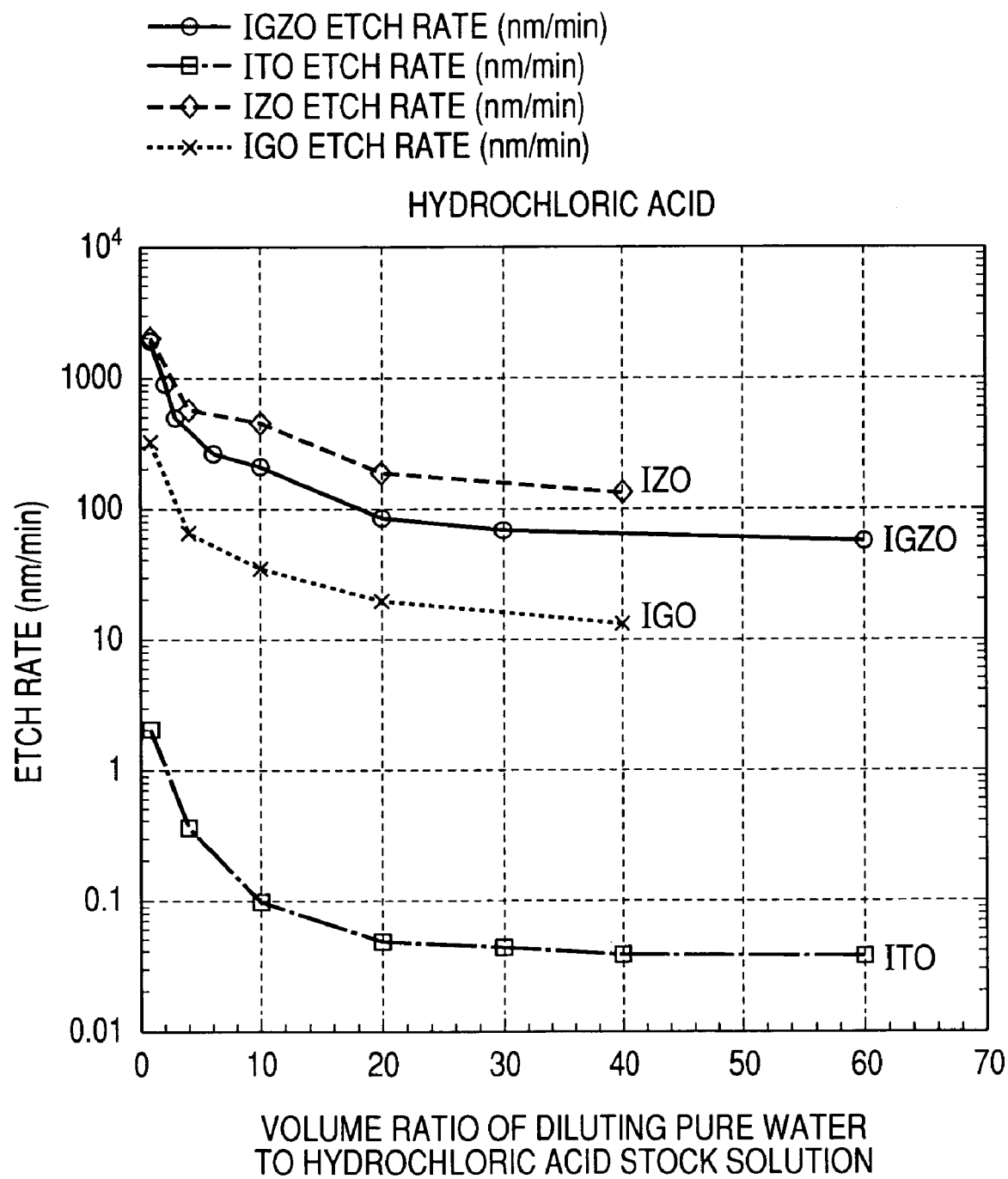
FIG. 7 is a graphical representation illustrating hydrochloric acid concentration dependence of an etch rate of an indium oxide film, for explaining an etching liquid containing hydrochloric acid according to Example 1 of the method of the present invention.
Figure 8:
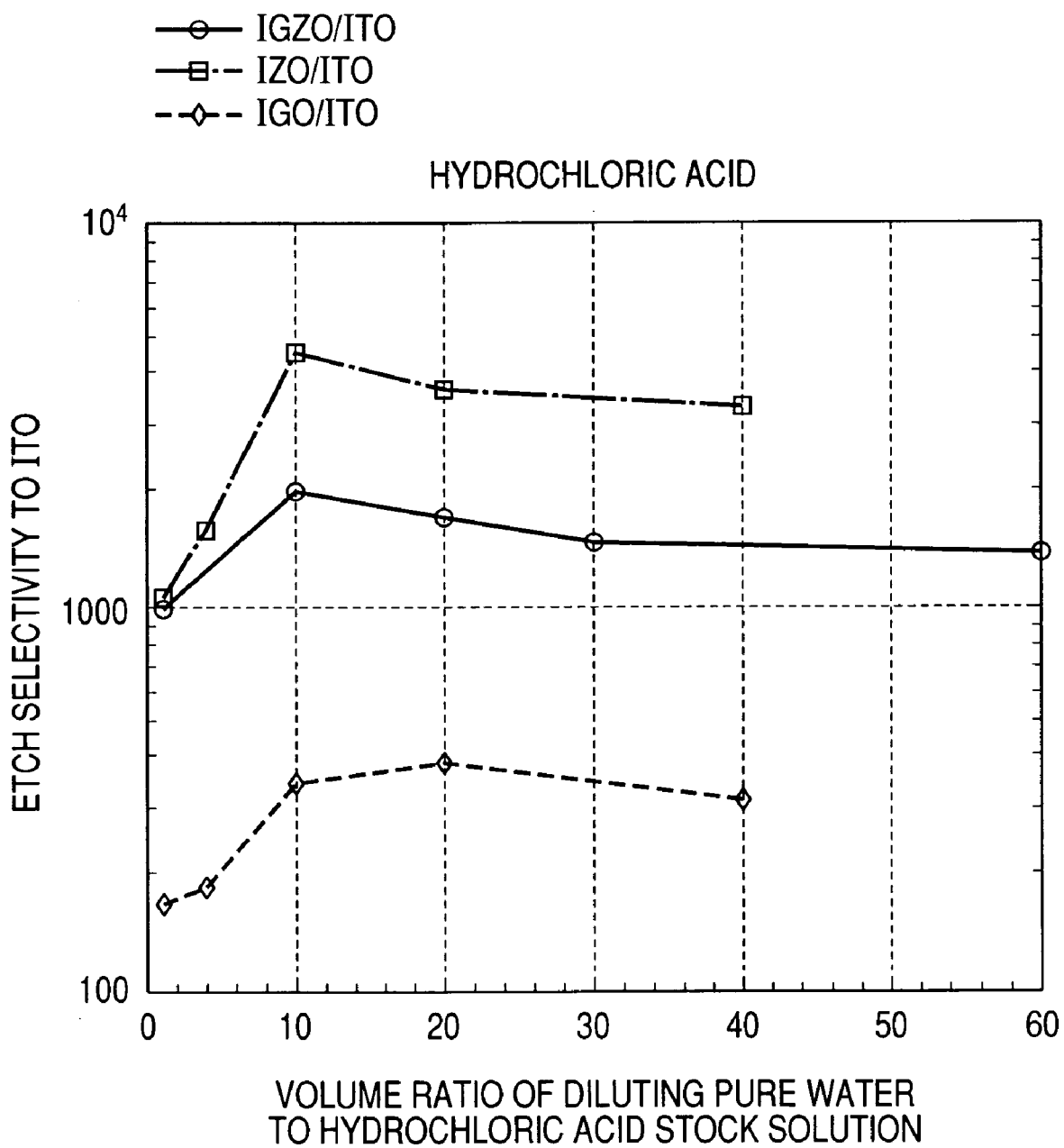
FIG. 8 is a graphical representation illustrating hydrochloric acid concentration dependence of an etch selectivity of an indium oxide film to ITO, for explaining an etching liquid containing hydrochloric acid according to Example 1 of the method of the present invention.

FIG. 7 is a graphical representation illustrating the hydrochloric acid concentration dependence of the etch rates of IZO, IGZO, IGO, and ITO when an aqueous hydrochloric acid solution is used at room temperature (ordinate: etch rate (nm/min); abscissa: volume ratio of diluting pure water to hydrochloric acid stock solution). As is seen from FIG. 7, as the hydrochloric acid concentration increases, the etch rate becomes higher. However, it is difficult to control etch selectivity and etching end point. FIG. 8 is a graphical representation illustrating the hydrochloric acid concentration dependence of the etch selectivities of IZO, IGZO, and IGO to ITO obtained by converting the data of FIG. 7 (ordinate: etch selectivity to ITO; abscissa: volume ratio of diluting pure water to hydrochloric acid stock solution). As is seen from FIGS. 7 and 8, in order to stably maintain high etch selectivities to ITO of the indium oxides including IZO, IGZO, and IGO, the hydrochloric-acid concentration of the etching liquid containing hydrochloric acid is desirably obtained by diluting with pure water in an amount 4 to 60 times the volume of the stock solution (concentration: 0.7% by weight or more and 8.5% by weight or less). For ease of the control of etching time, it is more desirable to obtain the hydrochloric acid concentration of the etching liquid containing hydrochloric acid by diluting with pure water in an amount 4 to 40 times the volume of the stock solution (concentration: 1.0% by weight or more and 8.5% by weight or less). In order to facilitate the control of the etching time, the most desirable hydrochloric acid concentration is obtained by diluting with pure water in an amount 10 to 30 times the volume of the stock solution (concentration: 1.4% by weight or more and 4% by weight less).

Figure 9:
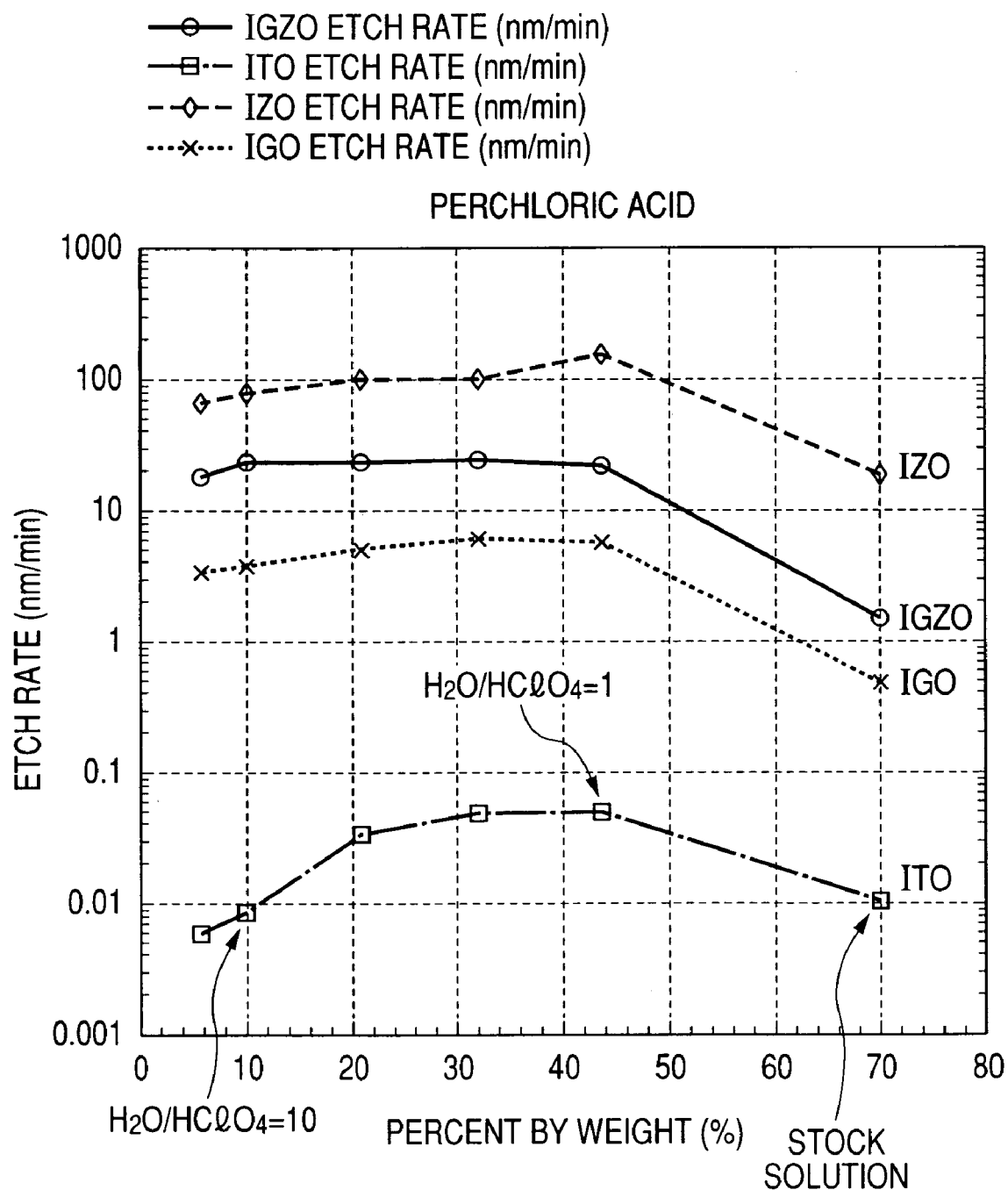
FIG. 9 is a graphical representation illustrating perchloric acid concentration dependence of an etch rate of an indium oxide film, for explaining an etching liquid containing perchloric acid according to Example 1 of the method of the present invention.
Figure 10:
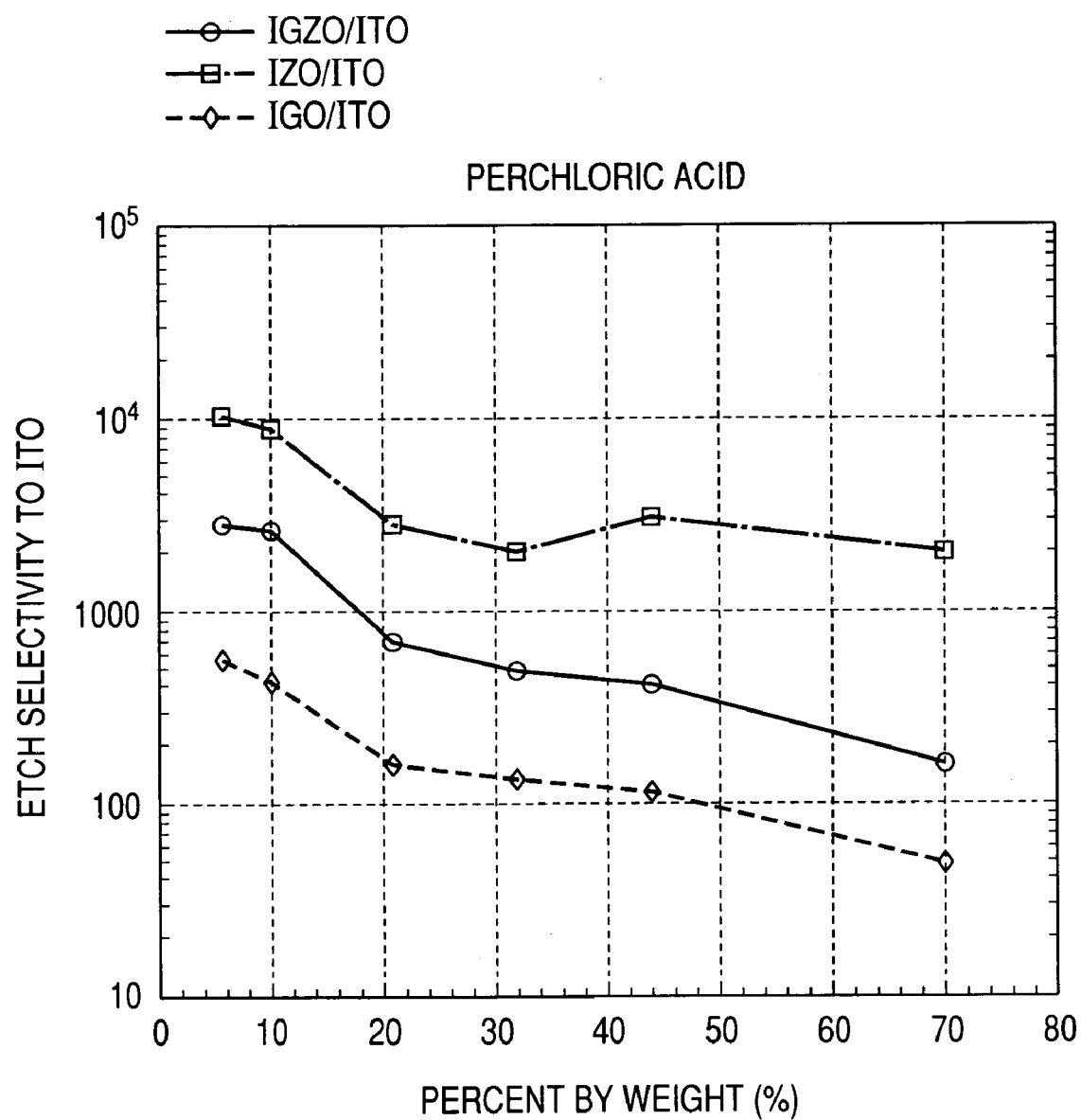
FIG. 10 is a graphical representation illustrating perchloric acid concentration dependence of an etch selectivity of an indium oxide film to ITO, for explaining an etching liquid containing perchloric acid according to Example 1 of the method of the present invention.

FIG. 9 is a graphical representation illustrating the perchloric acid concentration dependence of the etch rates of IZO, IGZO, IGO, and ITO when an aqueous perchloric acid solution is used at room temperature (ordinate: etch rate (nm/min); abscissa: % by weight concentration of perchloric acid). FIG. 10 is a graphical representation illustrating the perchloric acid concentration dependence of the etch selectivities of IZO, IGZO, and IGO to ITO obtained by converting the data of FIG. 9 (ordinate: etch selectivity to ITO; abscissa: % by weight concentration of perchloric acid). As is seen from FIGS. 9 and 10, in order to obtain high etch selectivities to ITO, a desirable perchloric acid concentration is obtained by dilution with pure water in an amount 1 to 20 times the volume of the stock solution (concentration: 5% by weight or more and 44% by weight or less). The etch rate markedly increases by adding pure water of the above-mentioned amount to the stock solution, as compared with that of the stock solution. However, the etch rate tends to be reduced due to an excessive amount of pure water. Therefore, the most desirable perchloric acid concentration is obtained by dilution with pure water in an amount 2 to 10 times the volume of the stock solution (concentration: 10% by weight or more and 32% by weight or less).

The wet etching experimental results of Example 1 show that the etch rates of the oxides almost stably have the relationship of IZO>IGZO>IGO>ITO. Therefore, it can be seen that in the respective etching liquids, the selectivities of IZO to IGZO, IGZO to IGO, or IGO to ITO are lower than the relative selectivities of other oxides. More specifically, the critical value (minimum etch selectivity) of the etch selective abilities of the above-mentioned etching liquids resides in any one of the three etch selectivities of IZO to IGZO, IGZO to IGO, and IGO to ITO. Table 3 shows the ranges of the selectivities of IZO to IGZO, IGZO to IGO, and IGO to ITO for the respective etching liquids.

TABLE 3

| Etch Selectivity | Acetic Acid | Citric Acid (Room Temperature) | Citric Acid (50° C.) | Hydrochloric Acid | Perchloric Acid |
|---|---|---|---|---|---|
| IZO/IGZO | 1.6-4.3 | 5.4-14.8 | 0.58-9.6 | 1.0-2.3 | 3.2-12.9 |
| IGZO/IGO | 3.9-5.5 | 3.8-10.4 | 5.3-21.7 | 4.3-5.9 | 3.1-6.0 |
| IGO/ITO | 78-140 | 9.0-55 | 18-83 | 166-396 | 50-570 |

As shown in Table 3, the selectivities of IGO to ITO are each at least one digit value, and all the aforementioned etching liquids can be applied thereto. In the case of IGZO to IGO, the use of the room temperature citric acid (e.g., citric acid concentration of about 45% by weight) enables to give etch selectivity of one or more digits, and is more desirable. The use of the citric acid of 50° C. (e.g., citric acid concentration of about 9% by weight) is the most desirable. In the case of IZO to IGZO, the use of the room temperature citric acid (e.g., citric acid concentration of about 29% by weight) enables to give etch selectivity of approximately one digit, and thus is more desirable. Further, the use of the perchloric acid enables to give higher etch selectivity (e.g., at near perchloric acid concentration of about 70% by weight), and thus is the most desirable.

As described above, the selectivity of the etching liquid varies according to the combination of the material to be etched and a matrix material. When etching a structure having an amorphous oxide layer containing In and at least one of Ga or Zn, it is necessary to select etching conditions, such as etching liquids, concentrations, and temperatures in accordance with the combination of the materials. According to the findings of the present inventor, the following conditions are desirable, for example.

(1) When performing selective etching of a layer structure including an ITO layer and an oxide layer including IZO, IGZO, and IGO formed on the ITO layer, desirable conditions are within the following ranges.
(Room temperature) Acetic acid concentration: 20 to 68% by weight (water to acetic acid stock solution: 0.5 to 4 times);
(Room temperature) Citric acid concentration: 3.8 to 45% by weight, more desirably 3.8 to 29% by weight;
(50° C.) Citric acid concentration: 16 to 45% by weight;
(Room temperature) Hydrochloric acid concentration: 0.7 to 8.5% by weight (water to hydrochloric acid stock solution: 4 to 60 times), more desirably 1.0 to 8.5% by weight (water to hydrochloric acid stock solution: 4 to 40 times), most desirably 1.4 to 4% by weight (water to hydrochloric acid stock solution: 10 to 30 times);
(Room temperature) Perchloric acid concentration: 5 to 44% by weight (water to perchloric acid stock solution: 1 to 20 times).

(2) When performing selective etching of a layer structure including an IGO layer and an oxide layer including IZO and IGZO formed on the IGO layer, desirable conditions are within the following ranges.
(Room temperature) Acetic acid concentration: 20 to 68% by weight (water to acetic acid stock solution: 0.5 to 4 times);
(Room temperature) Citric acid concentration: 3.8 to 45% by weight;
(50° C.) Citric-acid concentration: 16 to 45% by weight;
(Room temperature) Hydrochloric acid concentration: 0.7 to 8.5% by weight (water to hydrochloric-acid stock solution: 4 to 60 times), more desirably 2.0 to 8.5% by weight (water to hydrochloric acid stock solution: 4 to 20 times);
(Room temperature) Perchloric acid concentration: 5 to 44% by weight (water to perchloric-acid stock solution: 1 to 20 times), more desirably 5 to 21% by weight (water to perchloric-acid stock solution: 4 to 20 times).

(3) When performing selective etching of a layer structure including an IGZO layer and an oxide layer including IZO formed on the IGZO layer, desirable conditions are within the following ranges.
(Room temperature) Acetic acid concentration: 34 to 68% by weight (water to acetic acid stock solution: 0.5 to 2 times);
(Room temperature) Citric acid concentration: 3.8 to 45% by weight;

(50° C.) Citric-acid concentration: 16 to 45% by weight;
(Room temperature) Hydrochloric acid concentration: Unsuitable;
(Room temperature) Perchloric acid concentration: 21 to 70% by weight (water to perchloric acid stock solution: 0 to 4 times).

Example 2

Stack Structure

Figure 11A:
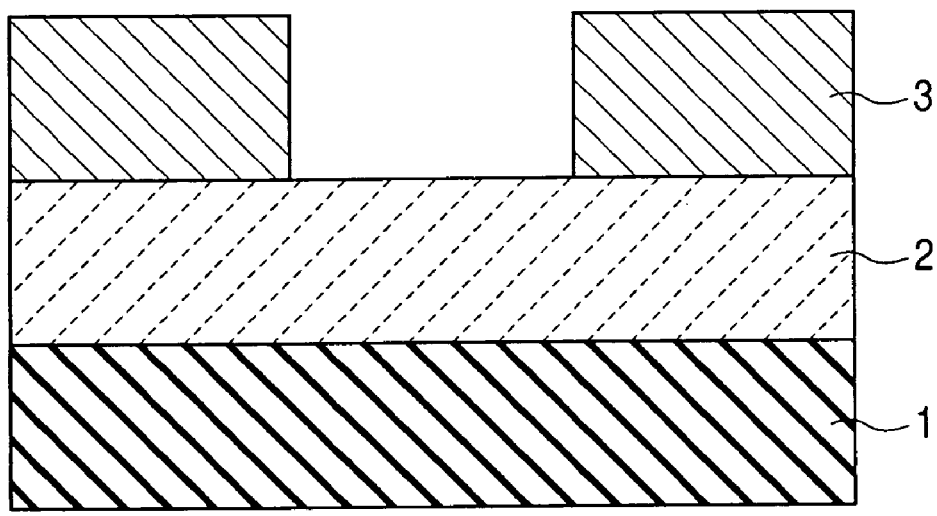
FIG. 11A is a schematic cross-sectional view of a layer structure before etching, for explaining an etching method according to Example 2 of the method of the present invention.
Figure 11B:
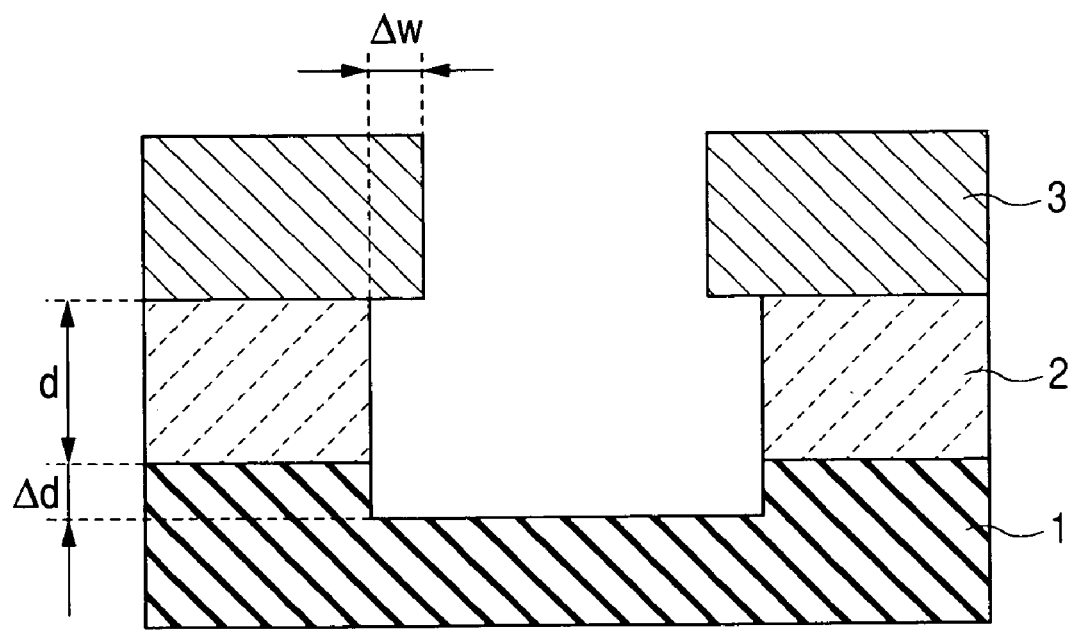
FIG. 11B is a schematic cross-sectional view of the layer structure after the etching, for explaining the etching method according to Example 2 of the method of the present invention.

FIGS. 11A and 11B are cross-sectional views illustrating the most common etching form according to an example of the present invention. A layer 1 is a material layer with a lower etch rate, a layer 2 is a material layer with a higher etch rate, and a layer 3 (resist layer) is used as an etching mask. In usual, when the selectivity of the layers 1 and 2 of FIGS. 11A and 11B is low, the depth of excessively etched area Δd of the layer 1 of FIG. 11B and an undercut amount Δw of the layer 2 are close to each other, resulting in variation of thin film transistor devices due to etching. It can be seen that with the use of the etching liquids of Example 1, the etch rates of oxides containing indium have the relationship of IZO>IGZO>IGO> and ITO. According to the present invention, when the layer 1 of FIGS. 11A and 11B is an ITO layer and the layer 2 is one material selected from the group consisting of IZO, IGZO, and IGO, there can be obtained the highly selective etching effect such that the etch selectivity of the layer 2 to the layer 1 is of about two digits or more. In this case, however, the etch selectivity obtained using citric acid is approximately of one digit. When the layer 1 of FIGS. 11A and 11B is an IGO layer and the layer 2 is any one of the two materials of IZO and IGZO, there can also be obtained the highly selective etching effect such that the etch selectivity of the layer 2 to the layer 1 is of about one digit. When, in FIGS. 11A and 11B, the layer 1 is an IGZO layer and the layer 2 is IZO, the selective etching of IZO to IGZO can be performed. By performing the etching as described in the above-mentioned examples, only the layer 2 can be etched and the etching can be precisely stopped at the surface of the layer 1. Therefore, the problems of the conventional etching methods, i.e., the variation in the electrode resistances, can be solved, and the characteristics of TFT devices can be made uniform.

Example 3

Top-Gate Bottom-Contact TFT

Figure 12:
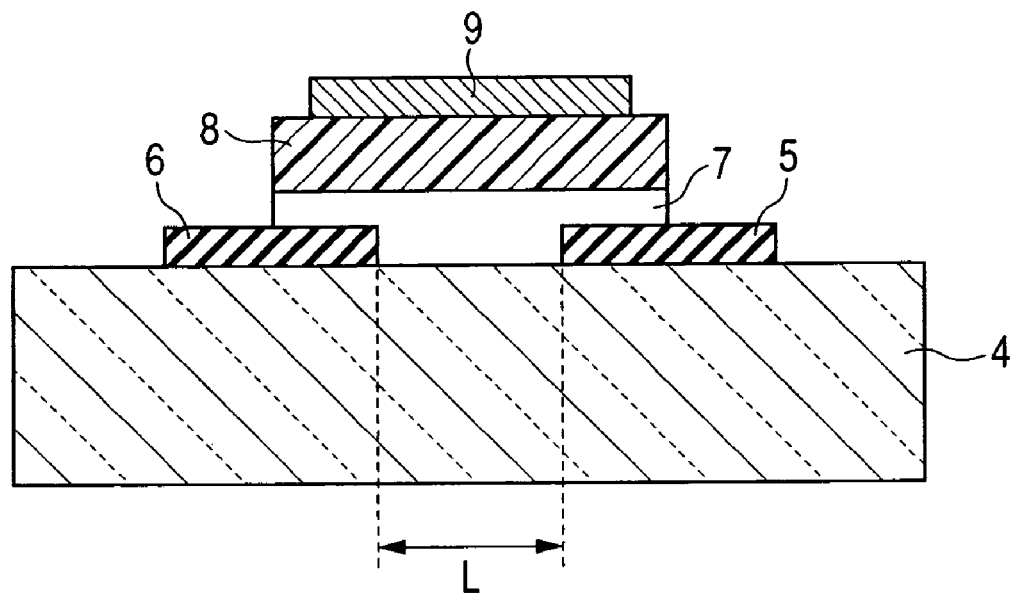
FIG. 12 is a schematic cross-sectional view illustrating a layer structure of a top-gate bottom-contact TFT according to Example 3 of the method of the present invention.
Figure 14A:
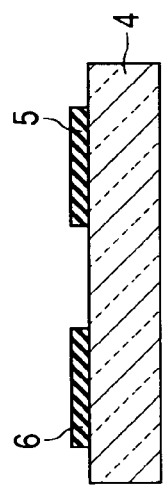
FIGS. 14A, 14B, 14C, 14D, 14E, 14F, 14G, 14H, 14I, 14J, and 14K are schematic cross-sectional views illustrating production steps of the top-gate bottom-contact TFT according to Example 3 of the method of the present invention.
Figure 14B:
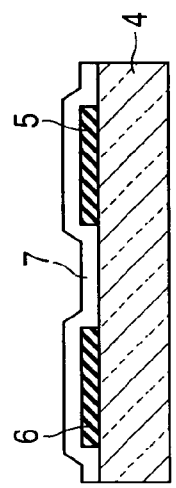

FIG. 12 is a schematic cross-sectional view illustrating a structure of a top-gate bottom-contact thin film transistor according to one example of the present invention. Reference numerals 4, 5, 6, 7, 8, and 9 denote a substrate (e.g., glass substrate), drain electrode, source electrode, active layer (channel layer), gate insulation film, and gate electrode, respectively. Reference character L denotes a channel length. FIGS. 14A to 14K are schematic cross-sectional views illustrating production steps of a top-gate bottom-contact thin film transistor as shown in FIG. 12 using the etching liquid of Example 1 of the present invention. As shown in FIG. 14A, a glass plate having a thickness of 500 mm (manufactured by Corning; trade name: Corning 1737 glass; glass transition temperature: 640° C.) is used as the substrate 4. A polycrystalline ITO film with a thickness of 250 nm is formed on the surface of the substrate 4 by reactive sputtering, and the drain electrode 5 and the source electrode 6 are patterned by dry etching. Next, as shown in FIG. 14B, an IGZO oxide film layer having a thickness of 100 nm is formed thereon as the active layer (channel layer) 7 by reactive sputtering. The IGZO oxide film includes In—Ga—Zn—O, and the composition in a crystalline state is represented by $InGaO_3(ZnO)_m$ (m is a natural number of less than 6). The transparent IGZO oxide film is a transparent amorphous semiconductor oxide film containing microcrystals therein and having an electron carrier concentration of less than $10^{18}/cm^3$.

Figure 14C:
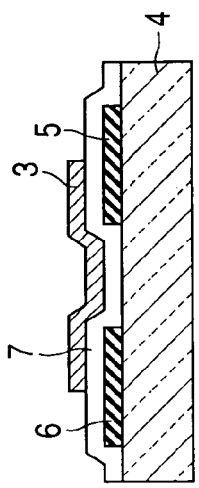
Figure 14D:
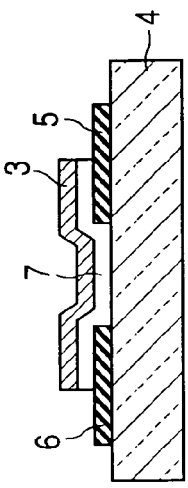

Next, FIG. 14C illustrates a step of exposing contact pads for wiring of the drain electrode 5 and the source electrode 6 to the surface of the active layer (channel layer) 7 and patterning the resist layer 3 for forming a channel. Next, as shown in FIG. 14D, this resist pattern is used as an etching mask, and the above-mentioned active layer (channel layer) 7 is etched with the etching liquid of Example 1, whereby the contact pads of the drain electrode 5 and source electrode 6 are exposed. At this time, the present invention enables to perform selective etching of the active layer 7 with respect to the drain electrode 5 and source electrode 6. For example, as is seen from the experimental results of Example 1, when dilute hydrochloric acid (concentration: about 4.0% by weight) diluted at room temperature with pure water in an amount 10 times the volume of hydrochloric acid stock solution is used, the etch selectivity of IGZO to ITO is about 2000. More specifically, because the etch rate of IGZO is high and the etch rate of ITO is low, the etching can be performed in such a manner that IGZO is greatly etched and ITO is hardly etched. More specifically, as shown in FIG. 11B, a two-layer structure of the ITO layer 1 and the IGZO layer 2 is etched with the above-mentioned liquid by using the resist 3 as an etching mask, whereby only the IGZO layer 2 is etched and the etching can be precisely stopped at the surface of the ITO layer 1. As shown in FIG. 14D, when the selective etching of the active layer 7 with respect to the drain electrode 5 and the source electrode 6 can be performed, the etching depth d of the active layer can be precisely controlled. More specifically, the above described conventional etching method of indium oxide film have problems of, for example, rise in electrical resistance or damage to the electrode and wiring due to the depth Δd of excessive etching in the drain electrode and source electrode. The present invention can solve the problem of the variation in the device performances.

Figure 14E:
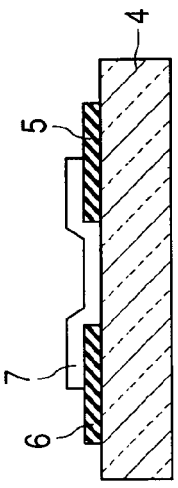
Figure 14F:
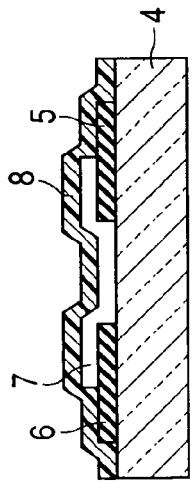
Figure 14G:
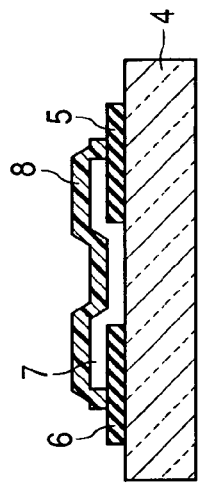

FIG. 14E illustrates a step of stripping the resist layer 3 with acetone after the selective etching of the active layer 7. FIG. 14F illustrates a step of forming a silicon nitride film ($Si_3N_4$) having a thickness of 100 nm as the gate insulation film layer 8 by reactive sputtering on the uppermost surface of the upper side of the substrate 4. In place of the silicon nitride film, silicon oxide, or dielectric materials such as silicon oxynitride, $HfO_2$, HfAlO, HfSiON, and $Y_2O_3$ can be used as the gate insulation film layer 8. As shown in FIG. 14G, the pattern of the gate insulation film layer 8 (silicon nitride film) is formed by photolithography and reactive ion etching (RIE). In the RIE, the silicon nitride film is dry etched using fluorocarbon gas (e.g., $CF_4$). It is known that indium oxides cannot be etched with ions or radicals generated from the fluorocarbon gas by plasma. FIG. 14G illustrates an example in which the active layer 7 is entirely covered with the gate insulation film layer 8. However, in this process, the gate insulation film layer 8 does not necessarily have to cover the entire active layer 7, and insulation may be made between the gate electrode layer 9 and the active layer 7 in subsequent steps. More specifically, the gate electrode layer 9 and the active layer 7 can be brought into contact with each other. When the active layer 7 is exposed, the etch selectivity of the electrode layer 9 with respect to the active layer 7, the drain electrode layer 5, and the source electrode layer 6 may be required in a subsequent step illustrated in FIG. 14J.

Figure 14H:
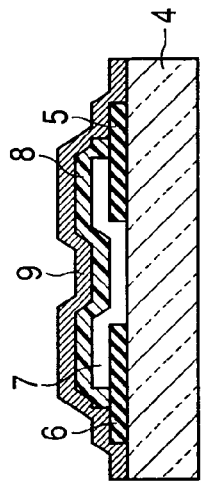
Figure 14I:
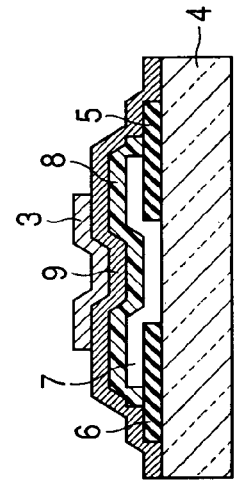
Figure 14J:
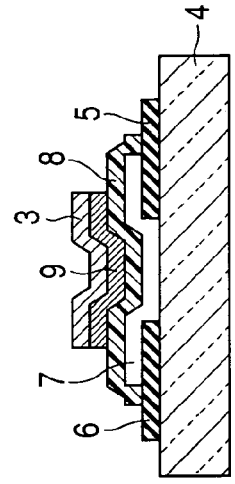

Next, as shown in FIG. 14H, an IZO film having a thickness of 100 nm is formed as the gate electrode layer 9 by reactive sputtering on the top surface of the upper side of the substrate 4. As shown in FIG. 14I, a pattern is formed on the gate electrode layer 9 using the resist layer 3 as an etching mask by photolithography. As shown in FIG. 14J, the gate electrode layer 9 is etched using an etching liquid containing citric acid to form the gate electrode 9. An etching liquid in which the weight ratio of citric acid crystal powders to pure water is 40:100 (concentration: 28.6% by weight) is used at room temperature (about 20° C.). The etch selectivity of IZO to IGZO is about 14.8, and the etch selectivity of IZO to ITO is about 1400. That is, also in the case where the active layer 7 is exposed from the gate insulation layer 8 using the etching liquid containing citric acid, selective etching of the gate electrode layer 9 (IZO) to the active layer (IGZO) and simultaneously to the drain electrode layer 5 (ITO) and the source electrode layer 6 (ITO) can be performed. When using a hydrochloric acid solution (mole concentration: 6 M) diluted with pure water in an amount equal to the volume of hydrochloric acid stock solution, the etch selectivity of IZO to the IGZO is as low as about 1.06, and selective etching of the gate electrode layer 9 (IZO) to the active layer (IGZO) cannot be performed.

Figure 14K:
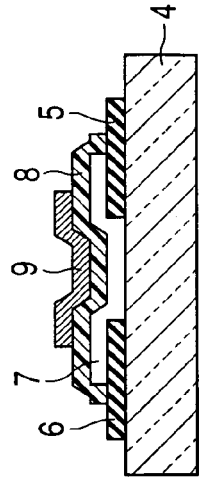

Finally, as shown in FIG. 14K, the resist layer 3 is stripped with acetone. A top-gate bottom-contact thin film transistor is obtained whose electrodes and active layers all have oxide films containing indium (ITO drain electrode layer 5, ITO source electrode layer 6, IGZO active layer 7, and IZO gate electrode 9).

Example 4

Bottom-Gate Top-Contact TFT

Figure 13:
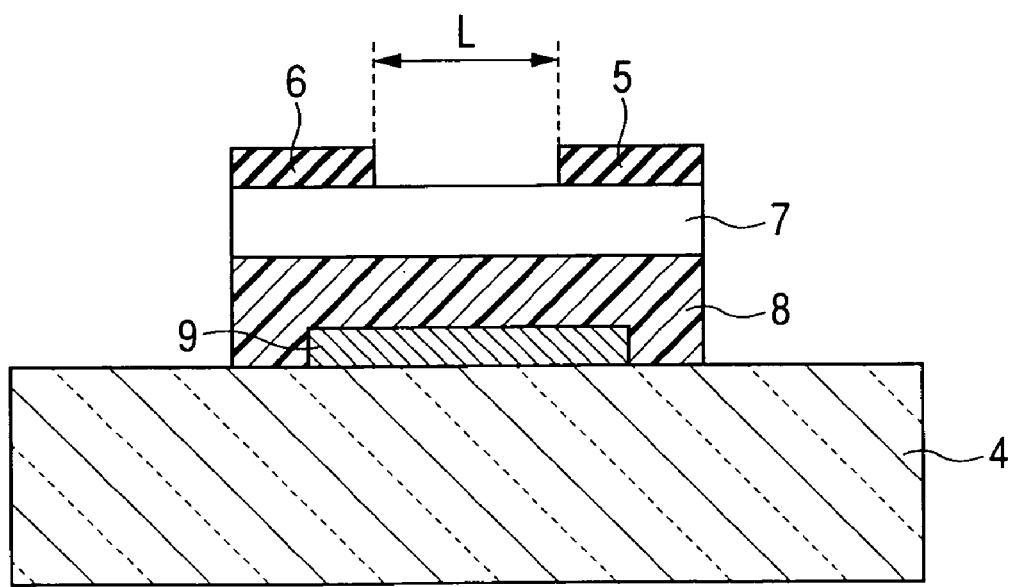
FIG. 13 is a schematic cross-sectional view illustrating a layer structure of a bottom-gate top-contact TFT according to Example 4 of the method of the present invention.
Figure 15A:
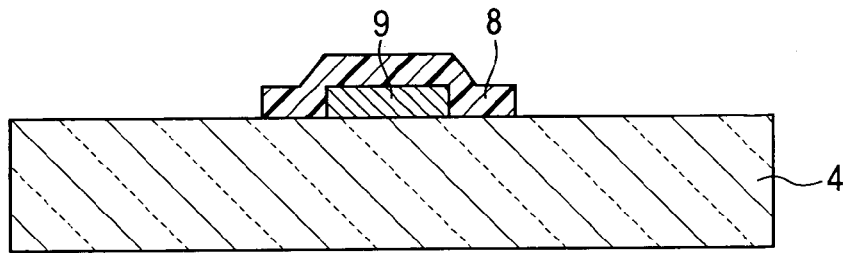
FIGS. 15A, 15B, 15C, and 15D are schematic cross-sectional views illustrating the bottom-gate top-contact TFT according to Example 4 of the method of the present invention.

FIG. 13 is a schematic cross-sectional view illustrating a structure of a bottom-gate top-contact thin film transistor according to another embodiment of the present invention. Reference numerals 4, 5, 6, 7, 8, and 9 denote a substrate (e.g., glass substrate), drain electrode, source electrode, active layer (channel layer), gate insulation film, and gate electrode, respectively. Reference character L denotes a channel length. FIGS. 15A, 15B, 15C, and 15D are schematic cross-sectional views illustrating production steps of a bottom-gate top-contact thin film transistor as shown in FIG. 13 using the etching liquid of Example 1 of the present invention. An IGO layer (gate electrode layer 9) having a film thickness of 100 nm is formed by reactive sputtering on the surface of a glass plate with a thickness of 500 mm (manufactured by Corning; trade name: Corning 1737 glass; glass transition temperature: 640° C.) as the substrate 4. A resist is patterned on the surface of the gate electrode layer 9 (IGO) as an etching mask by photolithography. Next, the gate electrode layer 9 (IGO) is patterned with dilute hydrochloric acid etching liquid having a concentration of 4.0% by weight and the resist is stripped. Next, a silicon nitride film ($Si_3N_4$) having a film thickness of 100 nm formed by reactive sputtering is patterned as the gate insulation film 8 on the surface of the gate electrode layer 9 by photolithography and dry etching. FIG. 15A is a schematic cross-sectional view illustrating the state in which the resist has been stripped after the dry etching. As with the case of the top-gate bottom-contact TFT, in place of the silicon nitride film, silicon oxide or dielectric materials such as silicon oxynitride, $HfO_2$, HfAlO, HfSiON, and $Y_2O_3$ can be used as the gate insulation film layer 8. For attaining the subsequent wiring and gate voltage application, the gate electrode 9 is not completely covered with the gate insulation film 8 but a part of the gate electrode 9 needs to be exposed as a contact pad. The contact pad of the gate electrode 9 is provided in a direction perpendicular to the drawing plane of FIG. 15A, but is not shown in FIG. 15A.

Figure 15B:
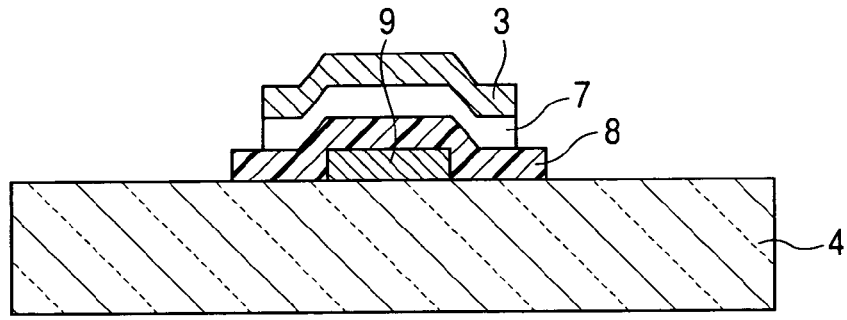

Next, an IGZO layer having a film thickness of 100 nm is formed thereon as the active layer (channel layer) 7 by reactive sputtering. The IGZO oxide film includes In—Ga—Zn—O, and the composition thereof in a crystalline state is represented by $InGaO_3(ZnO)m$ (m is a natural number of less than 6). The IGZO oxide film is a transparent amorphous semiconductor oxide containing microcrystals therein and having an electron carrier concentration of less than $10^{18}/cm^3$. Next, the resist layer 3 is patterned on the surface of the active layer 7 (IGZO) as an etching mask by photolithography. When using an etching liquid in which the weight ratio of citric acid crystal powder to pure water is 10:100 (concentration: 9.09% by weight) at about 50° C., the etch selectivity of IGZO to IGO is about 21.8, so that selective etching can be performed. That is, as shown in FIG. 15B, even if a part of the contact pad of the gate electrode 9 (IGO) is actually exposed using the etching liquid containing citric acid, selective etching of the active layer 7 (IGZO) can be performed. In this case, if an etching liquid having no selectivity is used, the gate electrode 9 is etched. As a result, the etching liquid is permeated into the interface between the gate electrode 9 and the gate insulation film 8, which makes the channel width of a TFT device smaller than the actually designed value. This poses problems that the ON-current of the TFT device is reduced, it is difficult to control variation in the device performance, and mass production cannot be achieved.

Next, the resist is stripped and an IZO film having a thickness of 250 nm is formed as a drain electrode and a source electrode by reactive sputtering on the uppermost surface of the upper side of the substrate 4.

Figure 15C:
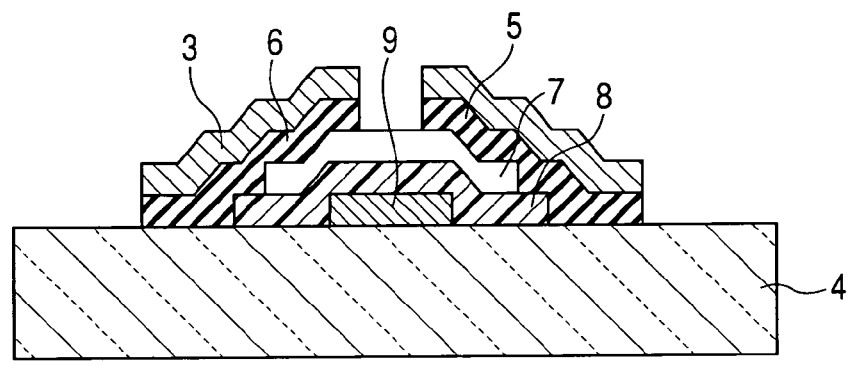

Then, the resist layer 3 is patterned on the surface of the IZO film as an etching mask by photolithography. Next, as shown in FIG. 15C, using an etching liquid containing citric acid, the IZO film is etched to form the drain electrode 5 and source electrode 6. In actual, the contact pad of the gate electrode layer 9 (IGO) is exposed as described above, to be brought into close contact with the IZO film. Thus, the selective etching of IZO to IGO is required. When using an etching liquid in which the weight ratio of citric acid crystal powder to pure water is 40:100 (concentration: 28.6% by weight) at room temperature (about 20° C.), the etch selectivity of IZO to IGZO is about 14.8, and the etch selectivity of IZO to IGO is about 56. That is, using the etching liquid containing citric acid, selective etching of the drain electrode layer 5 (IZO) and source electrode layer 6 (IZO) to the active layer 7 (IGZO) and simultaneously to the gate electrode layer 9 (IGO) can be performed. However, if an etching liquid having no selectivity is used in this stage, the gate electrode 9 is etched. As a result, the etching liquid is permeated into the interface between the gate electrode 9 and gate insulation film 8 which makes the channel width of a TFT device smaller than the actually designed value. Moreover, the active layer 7 is also etched, and the etching liquid is permeated into the interface between the drain electrode 5 and source electrode 6, and active layer 7. As a result, the channel length of a TFT device becomes larger than the actually designed value. In some cases, there are posed the serious problems that the active layer continues to be etched, so that due to the shortage of channel depth, the channel resistance is increased and the ON-current of a TFT device is markedly reduced, whereby the device cannot be operated. If the drain electrode layer 5 and source electrode layer 6 are formed by the lift-off process in this stage, there is posed the problem that when the photoresist is stripped, an edge of a pattern of a deposited film is curved up, and thereafter an electric wire crossing over the pattern edge is liable to be broken.

Figure 15D:
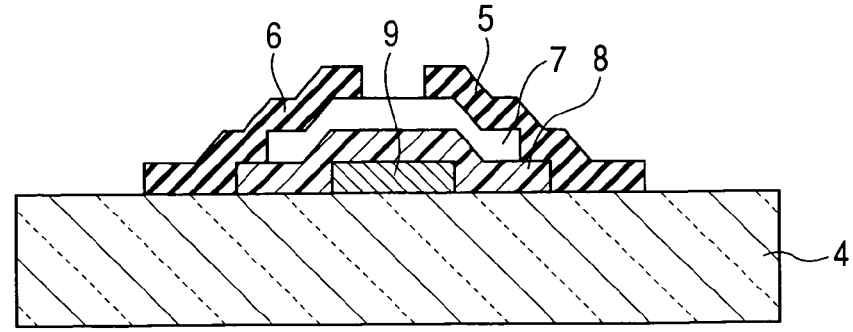

Finally, as shown in FIG. 15D, the resist layer 3 is stripped with acetone. Thus, a bottom-gate top-contact thin film transistor is obtained in which all the electrode and active layers are formed of oxide films containing indium (IZO drain electrode layer 5, IZO source electrode layer 6, IGZO active layer, 7, and IGO gate electrode 9).

Industrial Applicability

The present invention can provide a highly selective etching method of oxide semiconductor films containing In, Ga, and Zn and formed on a substrate, and also can form semiconductor devices having stable and uniform electrical characteristics on a substrate.

For example, a TFT in which a transparent oxide film is used as an active layer can be applied onto a soft plastic film, and also can be applied to the fields of pixel drivers of flexible displays, IC cards for authentication, product ID tags, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An etching method of an amorphous oxide in a structure comprising an ITO layer and an amorphous oxide layer, the method comprising etching the amorphous oxide layer, which comprises In and Ga, In and Zn, or In, Ga and Zn, using an etchant comprising any one of acetic acid, citric acid, hydrochloric acid, and perchloric acid at an etch rate larger than an etch rate of the ITO film.

2. An etching method of an amorphous oxide in a structure comprising an oxide layer comprising In and Ga and an amorphous oxide layer, the method comprising etching the amorphous oxide layer, which comprises In and Zn or In, Ga, and Zn, using an etchant comprising any one of acetic acid, citric acid, hydrochloric acid, and perchloric acid at an etch rate larger than an etch rate of the oxide layer comprising In and Ga.

3. An etching method of an amorphous oxide in a structure comprising an oxide layer comprising In, Ga, and Zn and an amorphous oxide layer, the method comprising etching the amorphous oxide layer, which comprises In and Zn, using an etchant comprising any one of acetic acid, citric acid, hydrochloric acid, and perchloric acid at an etch rate larger than an etch rate of the oxide layer comprising In, Ga and Zn.

4. The etching method of an amorphous oxide according to any one of claims 1-3, wherein a concentration of the acetic acid is 20 to 68% by weight, a concentration of the citric acid is 3.8 to 45% by weight, a concentration of the hydrochloric acid is 0.7 to 8.5% by weight, and a concentration of the perchloric acid is 5 to 44% by weight.

* * * * *